US012740295B2

(12) United States Patent
Hu et al.

(10) Patent No.: US 12,740,295 B2
(45) Date of Patent: Sep. 15, 2026

(54) ORGANIC LIGHT-EMITTING DIODE DISPLAY DEVICE

(71) Applicant: LG Display Co., Ltd., Seoul (KR)

(72) Inventors: Jae-Sung Hu, Paju-si (KR); Joon-Soo Han, Paju-si (KR); Jun-Ha An, Paju-si (KR); Jae-Hyuk Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 263 days.

(21) Appl. No.: 18/390,527

(22) Filed: Dec. 20, 2023

(65) Prior Publication Data

US 2024/0224752 A1 Jul. 4, 2024

(30) Foreign Application Priority Data

Dec. 29, 2022 (KR) ........................ 10-2022-0189152

(51) Int. Cl.

*H10K 59/80* (2023.01)
*G09G 3/3233* (2016.01)
*H10K 59/122* (2023.01)

(52) U.S. Cl.

CPC ......... *H10K 59/879* (2023.02); *G09G 3/3233* (2013.01); *H10K 59/122* (2023.02); *G09G 2300/0842* (2013.01)

(58) Field of Classification Search

CPC .................................................... H10K 59/879
See application file for complete search history.

(56) References Cited

U.S. PATENT DOCUMENTS

2017/0155094 A1* 6/2017 Joung .................. H10K 59/124
2020/0083482 A1 3/2020 Kim et al.
2020/0185655 A1* 6/2020 Jo .......................... H10K 59/38
2021/0202675 A1 7/2021 Jang et al.
2021/0367213 A1 11/2021 Joung et al.
2022/0140291 A1 5/2022 Kim et al.
2024/0090298 A1 3/2024 Jang et al.

FOREIGN PATENT DOCUMENTS

CN 111640777 A 9/2020
CN 112992986 A 6/2021
CN 113130597 A 7/2021
KR 10-2019-0070770 A 6/2019
KR 10-2020-0068970 A 6/2020
(Continued)

OTHER PUBLICATIONS

Office Action dated Jan. 23, 2025 issued in corresponding Japanese Patent Application No. 2023-218023 with English translation.
(Continued)

*Primary Examiner* — Christopher A Johnson
(74) *Attorney, Agent, or Firm* — Morgan, Lewis & Bockius LLP

(57) ABSTRACT

An organic light-emitting diode display device can include a display area, a non-display area outside the display area, a plurality of sub-pixels in the display area, each sub-pixel having an emission area and a non-emission area, and an overcoat layer including a plurality of micro lenses in the emission area of each sub-pixel. For an outermost sub-pixel among the plurality of sub-pixels, the overcoat layer has a first flat portion where some micro lenses are removed from the emission area.

18 Claims, 13 Drawing Sheets

(56) References Cited

FOREIGN PATENT DOCUMENTS

| | | | |
|---|---|---|---|
| KR | 10-2022-0060677 | A | 5/2022 |
| TW | 201813084 | A | 4/2018 |

OTHER PUBLICATIONS

Office Action dated Oct. 28, 2024 issued in corresponding Taiwanese Patent Application No. 112151169 with English translation.

Office Action dated Jun. 30, 2026 issued in the corresponding Korean Patent Application No. 10-2022-0189152.

* cited by examiner

ORGANIC LIGHT-EMITTING DIODE DISPLAY DEVICE

CROSS-REFERENCE TO RELATED APPLICATION

This application claims the benefit of and priority to Korean Patent Application No. 10-2022-0189152 filed on Dec. 29, 2022, the entirety of which is incorporated herein by reference for all purposes.

BACKGROUND

1. Technical Field

The present disclosure relates to a display device and particularly to, for example, without limitation, an organic light-emitting diode display device.

2. Description of the Related Art

As the information society progresses, a demand for different types of display devices increases, and flat panel display devices (FPD) such as liquid crystal display devices (LCD) and organic light-emitting diode display devices (OLED) have been developed and applied to various fields.

Among the flat panel display devices, organic light-emitting diode display devices, which are also referred to as organic electroluminescent display devices, emit light due to the radiative recombination of an exciton. The exciton is formed from an electron and a hole by injecting charges into a light-emitting layer between a cathode for injecting electrons and an anode for injecting holes in a light-emitting diode.

The organic light-emitting diode display device can be formed over a flexible substrate, such as plastic, and offers various advantages and improved properties. For instance, because it is self-luminous, the organic light-emitting diode display device has an excellent contrast ratio and an ultra-thin thickness, and has a response time of several micro seconds. As such, there are advantages in displaying moving images and videos without delays using the organic light-emitting diode display device.

Additionally, the organic light-emitting diode display device has a wide viewing angle and is stable under low temperatures. Further, since the organic light-emitting diode display device is generally driven by a low voltage of direct current (DC) (e.g., 5V to 15V), it is easy to design and manufacture the driving circuits of the organic light-emitting diode display device.

On the other hand, in the process of light generated in the light-emitting layer of the organic light-emitting diode display device passing through various components and being emitted to the outside, if some light is not emitted to the outside due to total internal reflection at the interface between the components, the light extraction efficiency is reduced, which leads to decreasing the luminance and increasing the power consumption.

The description of the related art should not be assumed to be prior art merely because it is mentioned in or associated with this section. The description of the related art may include information that describes one or more aspects of the subject technology, and the description in this section does not limit the invention.

SUMMARY

One or more aspects of the present disclosure are directed to providing a display device or an organic light-emitting diode display device that substantially obviates one or more problems due to limitations and disadvantages of the related art.

An aspect of the present disclosure is directed to providing an organic light-emitting diode display device with improved light extraction efficiency by having micro lenses.

Other aspects, features and advantages of the present disclosure are set forth in the present disclosure and will also be apparent from the present disclosure or may be learned by practice of the inventive concepts provided herein. Other aspects, features and advantages of the present disclosure may be realized and attained by the descriptions provided in the present disclosure, including the claims and the drawings.

To achieve these and other advantages and aspects of the present disclosure, as embodied and broadly described herein, an organic light-emitting diode display device according to one or more aspects of the present disclosure can include: a display area and a non-display area outside the display area; a plurality of sub-pixels in the display area, each sub-pixel having an emission area and a non-emission area; and an overcoat layer including a plurality of micro lenses in the emission area of each sub-pixel, wherein for an outermost sub-pixel among the plurality of sub-pixels, the overcoat layer has a first flat portion where some micro lenses are removed from the emission area.

An organic light-emitting diode display device according to one or more aspects of the present disclosure can include: a substrate; a plurality of sub-pixels, each sub-pixel having an emission area and a non-emission area; a circuit portion in the non-emission area of each sub-pixel, the circuit portion including a thin film transistor; an overcoat layer over the thin film transistors, and including a plurality of micro lenses in the emission area of each sub-pixel; a light-emitting diode in the emission area of each sub-pixel over the overcoat layer, and connected to the corresponding thin film transistor; and a bank having an opening corresponding to the emission area, wherein the plurality of sub-pixels includes first to nth sub-pixels (where n is an integer greater than 1) sequentially arranged along a first direction, wherein for each of the first sub-pixel and the nth sub-pixel, the bank has first and second side surfaces facing each other along the first direction, wherein for the first sub-pixel, the plurality of micro lenses are spaced apart from the first side surface of the bank and overlap the second side surface of the bank, and wherein for the nth sub-pixel, the plurality of micro lenses overlap the first side surface of the bank and are spaced apart from the second side surface of the bank.

A light emitting display device according to one or more aspects of the present disclosure can include: a plurality of sub-pixels in a display area, each sub-pixel having an emission area and a non-emission area; and a plurality of micro lenses in the emission area of each sub-pixel. The plurality of sub-pixels can include a first sub-pixel disposed near an edge side of the display area, and a second sub-pixel disposed away from the edge side of the display area. The emission area can have a first side. An arrangement of the plurality of micro lenses for the first sub-pixel can be different from an arrangement of the plurality of micro lenses for the second sub-pixel in that for the first sub-pixel, the plurality of micro lenses do not extend to the first side of the emission area, and for the second sub-pixel, the plurality of micro lenses extend at least to the first side of the emission area.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure.

In the drawings.

Figure 1:
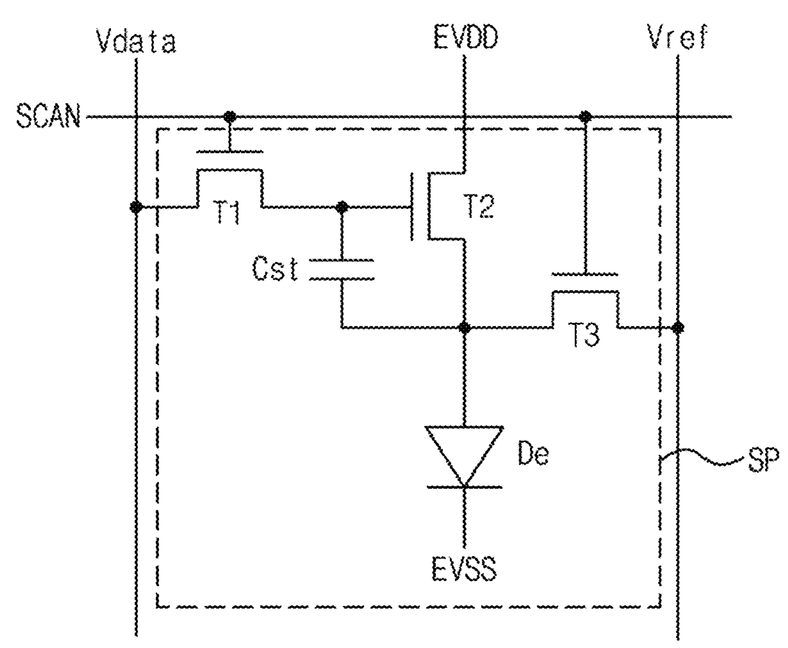
FIG. 1 is an example of an equivalent circuit diagram of one sub-pixel of an organic light-emitting diode display device according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term “comprise,” “have,” “include,” “contain,” “constitute,” “made of,” “formed of,” “composed of,” or the like is used with respect to one or more elements, one or more other elements may be added unless a term such as “only” or the like is used. The terms used in the present disclosure are merely used in order to describe particular example embodiments, and are not intended to limit the scope of the present disclosure. The terms of a singular form may include plural forms unless the context clearly indicates otherwise. The word “exemplary” is used to mean serving as an example or illustration. Embodiments are example embodiments. Aspects are example aspects. “Embodiments,” “examples,” “aspects,” and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term “may” encompasses all the meanings of the term “can.”

In one or more aspects, unless explicitly stated otherwise, an element, feature, or corresponding information (e.g., a level, range, dimension, size, or the like) is construed to include an error or tolerance range even where no explicit description of such an error or tolerance range is provided.

An error or tolerance range may be caused by various factors (e.g., process factors, internal or external impact, noise, or the like). In interpreting a numerical value, the value is interpreted as including an error range unless explicitly stated otherwise.

In describing a positional relationship, where the positional relationship between two elements (e.g., layers, films, regions, components, sections, or the like) is described, for example, using "on," "upon," "on top of," "over," "under," "above," "below," "beneath," "near," "close to," "adjacent to," "beside," "next to," "at or on a side of" or the like, one or more other elements may be located between the two elements unless a more limiting term, such as "immediate (ly)," "direct(ly)," or "close(ly)," is used. For example, when an element is described as being positioned "on," "on a top of," "upon," "on top of," "over," "under," "above," "below," "beneath," "near," "close to," "adjacent to," "beside," "next to," or "at or on a side of" another element, this description should be construed as including a case in which the elements contact each other directly as well as a case in which one or more additional elements are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "on," "above," "upper" and the like, can be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. In one or more aspects, the term "below" or the like, which is an example term, can include all directions, including directions of "above" and "below" and diagonal directions. Likewise, an exemplary term "above," "on" or the like can include all directions, including directions of "above" and "below" and diagonal directions.

In describing a temporal relationship, when the temporal order is described as, for example, "after," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, films, regions, components, sections, or the like), these elements should not be limited by these terms, for example, to any particular order, precedence, or number of elements. These terms are used only to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, region, component, section, or the like) is "connected," "coupled," "attached," "adhered," or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phase that an element (e.g., layer, film, region, component, section, or the like) is "provided," "disposed," "connected," "coupled," or the like in, on, with or to another element may be understood, for example, as that at least a portion of the element is provided, disposed, connected, coupled, or the like in, on, with or to at least a portion of another element. The phrase "through" may be understood, for example, to be at least partially through or entirely through. The phase that an element (e.g., layer, film, region, component, section, or the like) "contacts," "overlaps," or the like with another element may be understood, for example, as that at least a portion of the element contacts, overlaps, or the like with a least a portion of another element.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally. For example, the terms "first direction," "second direction," "first line," "second line," and the like, such as the terms "horizontal direction," "vertical direction," "diagonal direction," "X direction," "Y direction," "Z direction," "vertical line," and "horizontal line," should not be interpreted only based on a geometrical relationship in which the respective directions are parallel or perpendicular to each other, and may be meant as directions having wider directivities within the range within which the components of the present disclosure can operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, at least one of a plurality of elements can represent (i) one element of the plurality of elements, (ii) some elements of the plurality of elements, or (iii) all elements of the plurality of elements. Further, "at least some," "some,"

"some elements," "a portion," "portions," "at least a portion," "at least portions," "a part," "at least a part," "parts," "at least parts," "one or more," or the like of the plurality of elements can represent (i) one element of the plurality of elements, (ii) a part of the plurality of elements, (iii) parts of the plurality of elements, (iv) multiple elements of the plurality of elements, or (v) all of the plurality of elements. Moreover, at least a portion (or a part) of an element can represent (i) a portion (or a part) of the element, (ii) one or more portions (or parts) of the element, or (iii) the element, or the entirety of the element. A phrase that a plurality of first elements are connected to a plurality of second elements may describe, for example, that at least a part (or one or more first elements) of a plurality of first elements are connected to at least a part (or one or more second elements) of a plurality of second elements.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, section, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise. In one or more aspects, unless stated otherwise, the term "nth" may refer to "nnd" (e.g., 2nd where n is 2) or "nrd" (e.g., 3rd where n is 3), and n may be a natural number.

The term "of" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirely coupled to or combined with each other, may be technically associated with each other, and may be variously operated, interlocked, linked or driven together in various ways. Embodiments of the present disclosure may be implemented or carried out independently of each other or may be implemented or carried out together in a co-dependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in more detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

All the components of each organic light-emitting diode display device according to one or more embodiments or all embodiments of the present disclosure are operatively coupled and configured. For example, although some components of the organic light-emitting diode display devices may not be specifically described herein, the organic light-emitting diode display devices of the present disclosure include such components to fully and functionally operate.

An organic light-emitting diode display device according to one or more embodiments of the present disclosure includes a plurality of pixels arranged in the form of a matrix in a display area, and each pixel includes a plurality of sub-pixels. In an aspect, each sub-pixel can have the same or substantially the same configuration as other sub-pixels, and one example of the configuration of such sub-pixel is described in more detail with reference to FIG. 1 and FIG. 2, but other configurations are possible.

FIG. 1 is an example of an equivalent circuit diagram of one sub-pixel of an organic light-emitting diode display device according to an example embodiment of the present disclosure.

In FIG. 1, a sub-pixel SP of the organic light-emitting diode display device according to the example embodiment of the present disclosure can include first, second, and third transistors T1, T2, and T3, a storage capacitor Cst, and a light-emitting diode De. The first, second, and third transistors T1, T2, and T3 can be a switching transistor T1, a driving transistor T2, and a sensing transistor T3, respectively. The switching transistor T1, the driving transistor T2, and the sensing transistor T3 can be n-type transistors. However, the present disclosure is not limited to the foregoing. Alternatively, the switching transistor T1, the driving transistor T2, and the sensing transistor T3 can be p-type transistors or other types of transistors.

A gate line supplying a scan signal (or gate signal) SCAN and a data line supplying a data signal Vdata can cross each other, and the switching transistor T1 can be disposed at a crossing point of the gate line and the data line. A gate of the switching transistor T1 can be connected to the gate line to receive the gate signal SCAN, and a drain of the switching transistor T1 can be connected to the data line to receive the data signal Vdata.

In addition, a gate of the driving transistor T2 can be connected to a source of the switching transistor T1 and a first capacitor electrode of the storage capacitor Cst. A drain of the driving transistor T2 can be connected to a high potential line supplying a high potential voltage EVDD, and a source of the driving transistor T2 can be connected to an anode of the light-emitting diode De, a second capacitor electrode of the storage capacitor Cst, and a source of the sensing transistor T3.

A gate of the sensing transistor T3 can be connected to the gate line, and a drain of the sensing transistor T3 can be connected to a reference line supplying a reference voltage Vref. Alternatively, the gate of the sensing transistor T3 can be connected to a separate sensing line.

Here, source and drain locations of each of the transistors T1, T2, and T3 are not limited to the foregoing, and the locations can be interchanged or varied.

Meanwhile, a cathode of the light-emitting diode De can be connected to a low potential line supplying a low potential voltage EVSS. Alternatively, the cathode of the light-emitting diode De can be connected to a ground voltage.

During an emission period of one frame, the switching transistor T1 can be switched according to the gate signal SCAN transmitted through the gate line to thereby provide the gate of the driving transistor T2 with the data signal Vdata transmitted through the data line. The driving transistor T2 can be switched according to the data signal Vdata to thereby control a current of the light-emitting diode De. In this case, the storage capacitor Cst can maintain charges corresponding to the data signal Vdata for one frame. Accordingly, even if the switching transistor T1 is turned off, the storage capacitor Cst can allow the amount of the current flowing through the light-emitting diode De to be constant and the gray level shown by the light-emitting diode De to be maintained until a next frame.

In addition, one frame can further include a sensing period. During the sensing period, the sensing transistor T3 can be switched according to the gate signal SCAN transmitted through the gate line to thereby provide the source of the driving transistor T2 with the reference voltage Vref. The sensing transistor T3 can detect the voltage change of the source of the driving transistor T2 through the reference line and can calculate the threshold voltage Vth of the driving transistor T2 by comparing the amount of the voltage change with a determination range. Accordingly, by calculating the threshold voltage Vth in real time and compensating for the image data, it is possible to compensate for the change in the characteristics of the driving transistor T2 and prevent image degradation.

Figure 2:
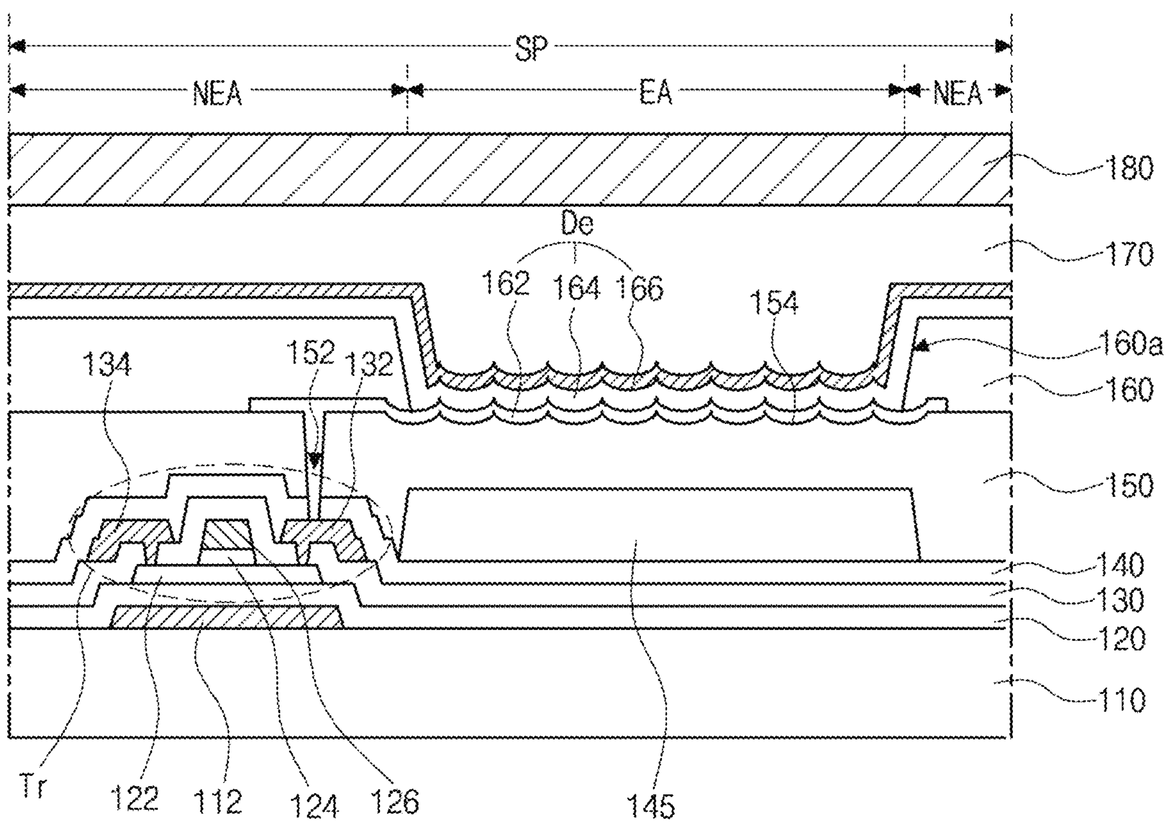
FIG. 2 is a schematic cross-sectional view of the organic light-emitting diode display device according to the example embodiment of the present disclosure.

FIG. 2 is a schematic cross-sectional view of the organic light-emitting diode display device according to the example embodiment of the present disclosure. A cross-section corresponding to one sub-pixel is shown, and a bottom emission-type organic light-emitting diode display device is described as an example and other variations are possible.

In FIG. 2, the organic light-emitting diode display device according to the example embodiment of the present disclosure can include a substrate 110 and a plurality of sub-pixels each having a thin film transistor Tr and a light-emitting diode De.

A sub-pixel SP having an emission area EA and a non-emission area NEA can be provided over the substrate 110. The light-emitting diode De can be disposed in the emission area EA, and the thin film transistor Tr can be disposed in the non-emission area NEA.

Specifically, a light-shielding layer 112 can be disposed in the non-emission area NEA over the substrate 110. The substrate 110 can be formed of a transparent insulating material. For example, the substrate 110 can be a glass substrate or a plastic substrate. Polyimide can be used for the plastic substrate, but embodiments of the present disclosure are not limited thereto.

The light-shielding layer 112 can be formed of at least one of aluminum (Al), copper (Cu), molybdenum (Mo), titanium (Ti), chromium (Cr), nickel (Ni), tungsten (W), or an alloy thereof and can have a single-layer structure or a multi-layer structure. For example, the light-shielding layer 112 can have a double-layer structure including a lower layer of a molybdenum-titanium (MoTi) alloy and an upper layer of copper (Cu), and the upper layer can have a thicker thickness than the lower layer. However, embodiments of the present disclosure are not limited to the foregoing.

A buffer layer 120 of an insulating material can be placed over the light-shielding layer 112. The buffer layer 120 can be disposed over substantially an entire surface of the substrate 110. The buffer layer 120 can be formed of an inorganic material such as silicon oxide ($SiO_2$) or silicon nitride (SiNx) and can have a single-layer structure or a multi-layer structure.

A semiconductor layer 122 can be patterned and placed over the buffer layer 120. The semiconductor layer 122 can overlap the light-shielding layer 112. The semiconductor layer 122 can be formed of an oxide semiconductor material. In this situation, the light-shielding layer 112 can block light incident on the semiconductor layer 122, thereby preventing the semiconductor layer 122 from being degraded due to the light.

Alternatively, the semiconductor layer 122 can be formed of polycrystalline silicon. In this situation, both ends of the semiconductor layer 122 can be doped with impurities.

A gate insulation layer 124 and a gate electrode 126 can be sequentially placed over the semiconductor layer 122. The gate insulation layer 124 and the gate electrode 126 can be disposed to correspond to a central portion of the semiconductor layer 122. The gate insulation layer 124 can be patterned to have substantially the same shape as the gate electrode 126. Alternatively, the gate insulation layer 124 can be disposed over substantially the entire surface of the substrate 110.

The gate insulation layer 124 can be formed of an inorganic insulating material such as silicon oxide ($SiO_2$) or silicon nitride (SiNx). Here, when the semiconductor layer 122 is formed of an oxide semiconductor material, the gate insulation layer 124 can be formed of silicon oxide ($SiO_2$). Alternatively, when the semiconductor layer 122 is formed of polycrystalline silicon, the gate insulation layer 124 can be formed of silicon oxide ($SiO_2$) or silicon nitride (SiNx).

The gate electrode 126 can be formed of a conductive material such as metal. For example, the gate electrode 126 can be formed of at least one of aluminum (Al), copper (Cu), molybdenum (Mo), titanium (Ti), chromium (Cr), nickel (Ni), tungsten (W), or an alloy thereof and can have a single-layer structure or a multi-layer structure. For example, the gate electrode 126 can have a double-layer structure including a lower layer of a molybdenum-titanium (MoTi) alloy and an upper layer of copper (Cu), and the upper layer can have a thicker thickness than the lower layer. However, embodiments of the present disclosure are not limited to the foregoing.

An interlayer insulation layer 130 of an insulating material can be disposed over the gate electrode 126 over substantially the entire surface of the substrate 110. The interlayer insulation layer 130 can be formed of an inorganic insulating material, such as silicon oxide ($SiO_2$) or silicon nitride (SiNx), or can be formed of an organic insulating material, such as photo acryl or benzocyclobutene.

The interlayer insulation layer 130 can have contact holes exposing top surfaces of both ends of the semiconductor layer 122. The contact holes can be disposed at both sides of the gate electrode 126 and can be spaced apart from the gate electrode 126.

Next, source and drain electrodes 132 and 134 of a conductive material such as metal can be placed over the interlayer insulation layer 130.

The source and drain electrodes 132 and 134 can be formed of at least one of aluminum (Al), copper (Cu), molybdenum (Mo), titanium (Ti), chromium (Cr), nickel (Ni), tungsten (W), or an alloy thereof and can have a single-layer structure or a multi-layer structure. For example, each of the source and drain electrodes 132 and 134 can have a double-layer structure including a lower layer of a molybdenum-titanium (MoTi) alloy and an upper layer of copper (Cu), and the upper layer can have a thicker thickness than the lower layer. Alternatively, the source and drain electrodes 132 and 134 can have a triple-layer structure. However, embodiments of the present disclosure are not limited to the foregoing.

The source and drain electrodes 132 and 134 can be spaced apart from each other with the gate electrode 126 interposed therebetween and can be in contact with the both ends of the semiconductor layer 122 through the contact holes.

The semiconductor layer 122, the gate electrode 126, the source electrode 132, and the drain electrode 134 can constitute a thin film transistor Tr. Here, the thin film transistor Tr can have a coplanar structure in which the gate electrode 126 and the source and drain electrodes 132 and 134 are disposed at the same side with respect to the semiconductor layer 122, for example, the gate electrode 126 and the source and drain electrodes 132 and 134 can be disposed over the semiconductor layer 122.

Alternatively, the thin film transistor Tr can have an inverted staggered structure in which the gate electrode and the source and drain electrodes are disposed at different sides with respect to the semiconductor layer, for example, the gate electrode can be disposed under the semiconductor layer and the source and drain electrodes can be disposed over the semiconductor layer. In this case, the semiconductor layer can be formed of an oxide semiconductor material or amorphous silicon.

However, embodiments of the present disclosure are not limited to the foregoing. The stacked structure of the components of the thin film transistor Tr can be varied.

The thin film transistor Tr can be the driving transistor T2 of FIG. 1. Meanwhile, at least one thin film transistor having the same structure as the thin film transistor Tr, for example, the switching transistor T1 of FIG. 1 and the sensing transistor T3 of FIG. 1 can be further formed in the non-emission area NEA over the substrate 110. However, embodiments of the present disclosure are not limited to the foregoing. Alternatively, at least one thin film transistor having a different structure from the thin film transistor Tr can be further provided in the non-emission area NEA over the substrate 110.

A passivation layer 140 of an insulating material can be disposed over the source and drain electrodes 132 and 134 as well as the gate electrode 126 over substantially the entire surface of the substrate 110. The passivation layer 140 can be formed of an inorganic insulating material, such as silicon oxide ($SiO_2$) or silicon nitride (SiNx).

A color filter 145 can be placed over the passivation layer 140. The color filter 145 can be placed to correspond to the emission area EA and can be one of red, green, and blue color filters.

An overcoat layer 150 of an insulating material can be disposed over the color filter 145 over substantially the entire surface of the substrate 110. The overcoat layer 150 and the passivation layer 140 can have a source contact hole 152 exposing the source electrode 132.

The overcoat layer 150 can be formed of an organic insulating material. For example, the overcoat layer 150 can be formed of photo acryl. However, embodiments of the present disclosure are not limited to the foregoing.

The overcoat layer 150 can include a plurality of micro lenses 154 at a top surface thereof in the emission area EA. The plurality of micro lenses 154 can constitute a micro lens array (MLA), and each of the plurality of micro lenses 154 can have a depressed portion. Here, adjacent portions of two micro lenses 154 can form an embossed portion, and each depressed portion can be surrounded by the embossed portion. Accordingly, the micro lens array can be configured such that the depressed portion and the embossed portion can be alternately disposed or the micro lenses 154 can have other shapes and configurations.

Meanwhile, the overcoat layer 150 can have substantially a flat top surface in the non-emission area NEA.

A first electrode 162 of a conductive material having a relatively high work function can be placed over the overcoat layer 150 in the emission area EA. For example, the first electrode 162 can be formed of a transparent conductive material, such as indium tin oxide (ITO) or indium zinc oxide (IZO), but embodiments are not limited thereto.

The first electrode 162 can be extended into the non-emission area NEA and can be in contact with the source electrode 132 through the source contact hole 152.

In the emission area EA, the first electrode 162 can be formed along the morphology or contour of the top surface of the overcoat layer 150 including the micro lenses 154. Accordingly, the first electrode 162 can have an uneven top surface.

A bank 160 of an insulating material can be placed over the first electrode 162. The bank 160 can be formed of an organic insulating material. The bank 160 can overlap and cover edges of the first electrode 162. The bank 160 can have an opening 160*a* corresponding to (at or for) the emission area EA, and a central portion of the first electrode 162 can be exposed through the opening 160*a*.

Next, a light-emitting layer 164 can be placed over the first electrode 162 exposed through the opening 160*a* of the bank 160. The light-emitting layer 164 can be disposed over substantially the entire surface of the substrate 110. Accordingly, in the emission area EA, the light-emitting layer 164 can be disposed over the first electrode 162 and in contact with the first electrode 162. In the non-emission area NEA, the light-emitting layer 164 can be disposed over the bank 160 and in contact with a top surface of the bank 160. Further, the light-emitting layer 164 can be in contact with a side surface of the bank 160.

The light-emitting layer 164 can emit white light and can include at least one hole auxiliary layer, at least one light-emitting material layer, and at least one electron auxiliary layer, which constitute one light-emitting unit. The hole auxiliary layer can include at least one of a hole injection layer (HIL) and a hole transport layer (HTL). In addition, the electron auxiliary layer can include at least one of an electron injection layer (EIL) and an electron transport layer (ETL).

The light-emitting layer 164 can have a stack structure in which two or more light-emitting units emitting different colors are stacked, and a charge generation layer can be provided between two or more light-emitting units.

In the emission area EA, the light-emitting layer 164 can be formed along the morphology or contour of the top surface of the first electrode 162. Accordingly, in the emission area EA, the light-emitting layer 164 can be formed substantially along the morphology or contour of the top surface of the overcoat layer 150, and the light-emitting layer 164 can have an uneven top surface.

Here, the light-emitting layer 164 can have different thicknesses depending on the position. For example, a thickness of a portion of the light-emitting layer 164 corresponding to the depressed portion of the micro lens 154 can be thicker than a thickness of a portion of the light-emitting layer 164 corresponding to the embossed portion where two micro lenses 154 are adjacent to each other, and the light-emitting layer 164 can have the thinnest thickness between the depressed portion and the embossed portion.

A second electrode 166 of a conductive material, having a relatively low work function, can be placed over the light-emitting layer 164 over substantially the entire surface of the substrate 110. In the emission area EA, the second electrode 166 can be disposed over the first electrode 162 and the light-emitting layer 164, and in the non-emission area NEA, the second electrode 166 can be disposed over the bank 160 and the light-emitting layer 164.

The second electrode 166 can be formed of aluminum, magnesium, silver, or an alloy thereof.

In the emission area EA, the second electrode 166 can be formed along the morphology or contour of the top surface of the light-emitting layer 164. Accordingly, in the emission area EA, the second electrode 166 can be formed substantially along the morphology or contour of the top surface of the overcoat layer 150 including the micro lenses 154, and the second electrode 166 can have an uneven top surface.

The first electrode 162, the light-emitting layer 164, and the second electrode 166 can constitute the light-emitting diode De. Here, the first electrode 162 can function as an anode, and the second electrode 166 can function as a cathode, but embodiments are not limited thereto.

The first electrode 162 can be formed of a transparent conductive material transmitting light, and the second electrode 166 can be formed of a metal material reflecting light. Accordingly, light from the light-emitting layer 164 can be emitted through the first electrode 162 and can pass through the color filter 145 and the substrate 110 to be output to the outside.

An encapsulation layer 170 can be placed over the second electrode 166 over substantially the entire surface of the substrate 110. The encapsulation layer 170 can be in the form of a face seal made of an organic or inorganic insulating material that is transparent and has adhesive properties or can have a multi-layer structure in which an inorganic layer, an organic layer, and an inorganic layer are stacked.

A counter substrate 180 can be placed over the encapsulation layer 170. The counter substrate 180 can be a glass substrate or a metal substrate. Alternatively, the counter substrate 180 can be formed in the form of a film.

The encapsulation layer 170 and the counter substrate 180 can prevent substances such as moisture, dust or oxygen from being introduced into the light-emitting diode De from the outside or prevent an external impact from being applied to the light-emitting diode De.

As described above, the overcoat layer 150 can have the plurality of micro lenses 154 at the top surface thereof in the emission area EA, and the first electrode 162, the light-emitting layer 164, and the second electrode 166 placed over the overcoat layer 150 can be formed substantially along the morphology or contour of the top surface of the overcoat layer 150. Accordingly, in the emission area EA, the first electrode 162, the light-emitting layer 164, and the second electrode 166 can have uneven patterns corresponding to the micro lenses 154 of the overcoat layer 150. Further, in the emission area EA, the first electrode 162, the light-emitting layer 164, and the second electrode 166 can also have micro lenses.

The micro lenses 154 can improve the light extraction efficiency by changing the progress path of light so that the light, which was completely reflected and extinguished after being emitted from the light-emitting layer, can be extracted to the outside.

By the way, the overcoat layer 150 can be formed by applying an organic material over the substrate 110, and then a photolithography process and an ashing process can be performed, thereby forming the micro lenses 154. In this case, a thickness of the overcoat layer 150 can be relatively thin on or at the edge side of the display area. Thus, the overcoat layer 150 and the passivation layer 140 corresponding to the micro lenses 154 on or at the edge side of the display area may be lost during the ashing process, and an electrical short circuit may occur between the first electrode 162 and the lines, resulting in bright spot defects. Accordingly, in the organic light-emitting diode display device according to one or more embodiments of the present disclosure, the micro lenses of the sub-pixel disposed at the edge of the display area can be arranged differently from the micro-lenses of other sub-pixels. A first example embodiment of the present disclosure is described in more detail with reference to FIG. 3.

Figure 3:
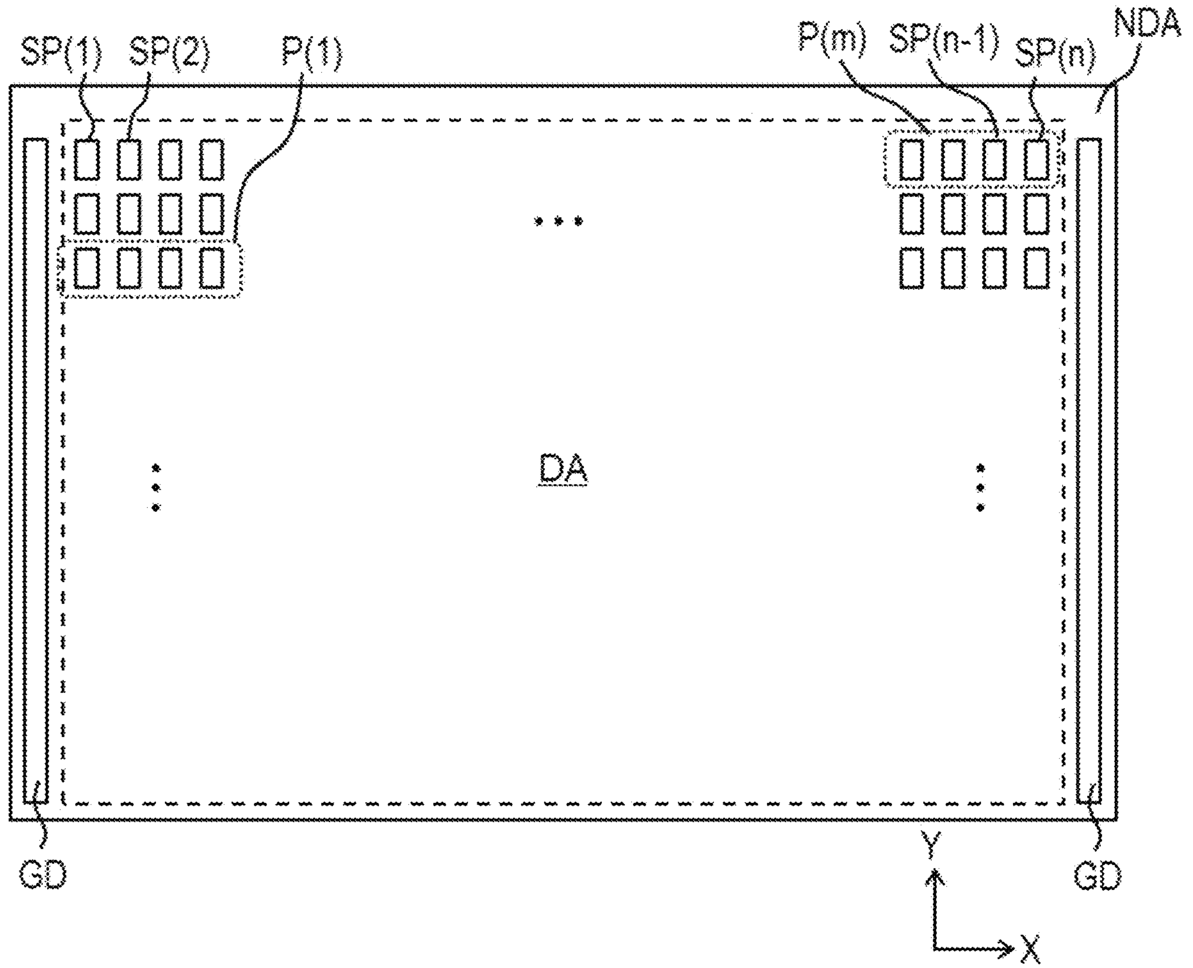
FIG. 3 is a schematic plan view of an organic light-emitting diode display device according to a first example embodiment of the present disclosure.

FIG. 3 is a schematic plan view of an organic light-emitting diode display device according to a first example embodiment of the present disclosure, and is described in more detail with reference to FIG. 1 and FIG. 2 together.

In FIG. 3, the organic light-emitting diode display device according to the first example embodiment of the present disclosure can include a display area DA displaying an image and a non-display area NDA outside the display area DA. The non-display area NDA can surround at least one side of the display area DA.

In one or more examples, the organic light-emitting diode display device of the present disclosure can have a rectangular shape, which includes long sides at upper and lower sides and short sides at left and right sides. The display area DA can also have a rectangular shape. The long sides can extend in and be parallel to a horizontal direction, and the short sides can extend in and be parallel to a vertical direction.

Here, the horizontal direction, which is an X direction, can be defined as a first direction or a long side direction of the display area DA, and the vertical direction, which is a Y direction, can be defined as a second direction or a short side direction of the display area DA.

A plurality of pixels P(1) to P(m) can be provided in the display area DA, and a gate driving portion GD can be provided in the non-display area NDA. The gate driving portion GD can be disposed in the non-display area NDA at the left and right sides of the display area DA and can be a gate-in-panel type, which is formed together with elements of the plurality of pixels P(1) to P(m).

Specifically, m pixels P(1) to P(m) (where m is an integer greater than 0) can be disposed along the horizontal direction in the display area DA, and each pixel P(1) to P(m) can include a plurality of sub-pixels. In the display area DA, n sub-pixels SP(1) to SP(n) (where n is an integer greater than 1) can be disposed along the horizontal direction. For example, when one pixel P(m) includes four sub-pixels, 4 m sub-pixels can be arranged along the horizontal direction in the display area DA.

Here, an emission area EA of an outermost sub-pixel of the display area DA can include a flat portion where the plurality of micro lenses 154 is removed.

In one or more aspects, a first sub-pixel SP(1) that is an outermost sub-pixel at the left short side of the display area DA may be sometimes referred to as an initial sub-pixel or an initial sub-pixel SP(1). In one or more aspects, an nth sub-pixel SP(n) that is an outermost sub-pixel at the right short side of the display area DA may be sometimes referred to as a last sub-pixel, a last sub-pixel SP(n) or a last nth sub-pixel SP(n).

Thus, the emission area EA of each initial sub-pixel SP(1) and each last sub-pixel SP(n) can include a flat portion where the plurality of micro lenses 154 is removed. Accordingly, the micro lens arrangement in each of the initial sub-pixel SP(1) and the last sub-pixel SP(n) can be different from the micro lens arrangement in each of a second sub-pixel SP(2) to an (n−1)th sub-pixel SP(n−1).

In the foregoing example, if the display area DA has r rows, wherein each row has m pixels P(1) to P(m) (where m is an integer greater than 0, and r is an integer greater than 0), then an initial sub-pixel SP(1) may be a first sub-pixel SP(1) of a first pixel P(1) at each of the r rows, and a last sub-pixel SP(n) may be an nth sub-pixel SP(n) of an mth pixel P(m) at each of the r rows. In this example, since there are r number of rows, there may be r number of initial sub-pixels (e.g., r number of outermost sub-pixels at the left short side of the display area DA), and there may be r number of last sub-pixels (e.g., r number of outermost sub-pixels at the right short side of the display area DA).

In one or more aspects, the initial sub-pixels may include all sub-pixels arranged along the first column at the left side of the display area DA. The last sub-pixels may include all sub-pixels arranged along the last column at the right side of the display area DA.

In one or more aspects, each initial sub-pixel SP(1) may be sometimes referred to as an initial sub-pixel, the initial sub-pixel, an initial sub-pixel SP(1), or the initial sub-pixel SP(1), and vice versa. In one or more aspects, each last nth sub-pixel SP(n) may be sometimes referred to as a last sub-pixel, the last sub-pixel, a last sub-pixel SP(n), the last sub-pixel SP(n), a last nth sub-pixel SP(n), or the last nth sub-pixel SP(n), and vice versa.

As used herein, in one or more aspects, the phrase "is removed" may be understood as "is absent," "is not present," "is missing," "does not exist," or the like.

The organic light-emitting diode display device according to the first example embodiment of the present disclosure is described in more detail with reference to FIGS. 4 to 10.

Figure 4:
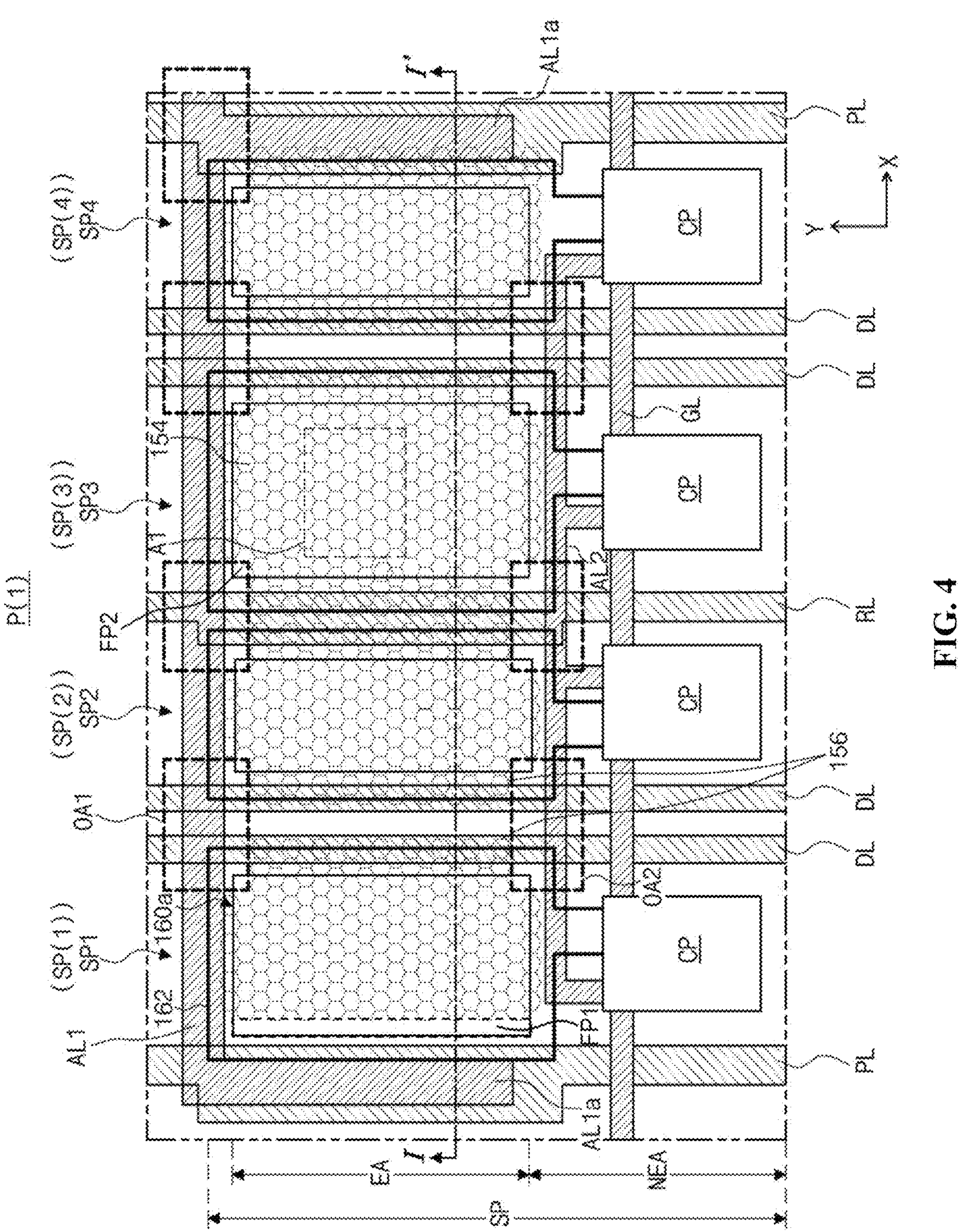
FIG. 4 is a schematic plan view of a first pixel of an organic light-emitting diode display device according to the first example embodiment of the present disclosure.
Figure 5:
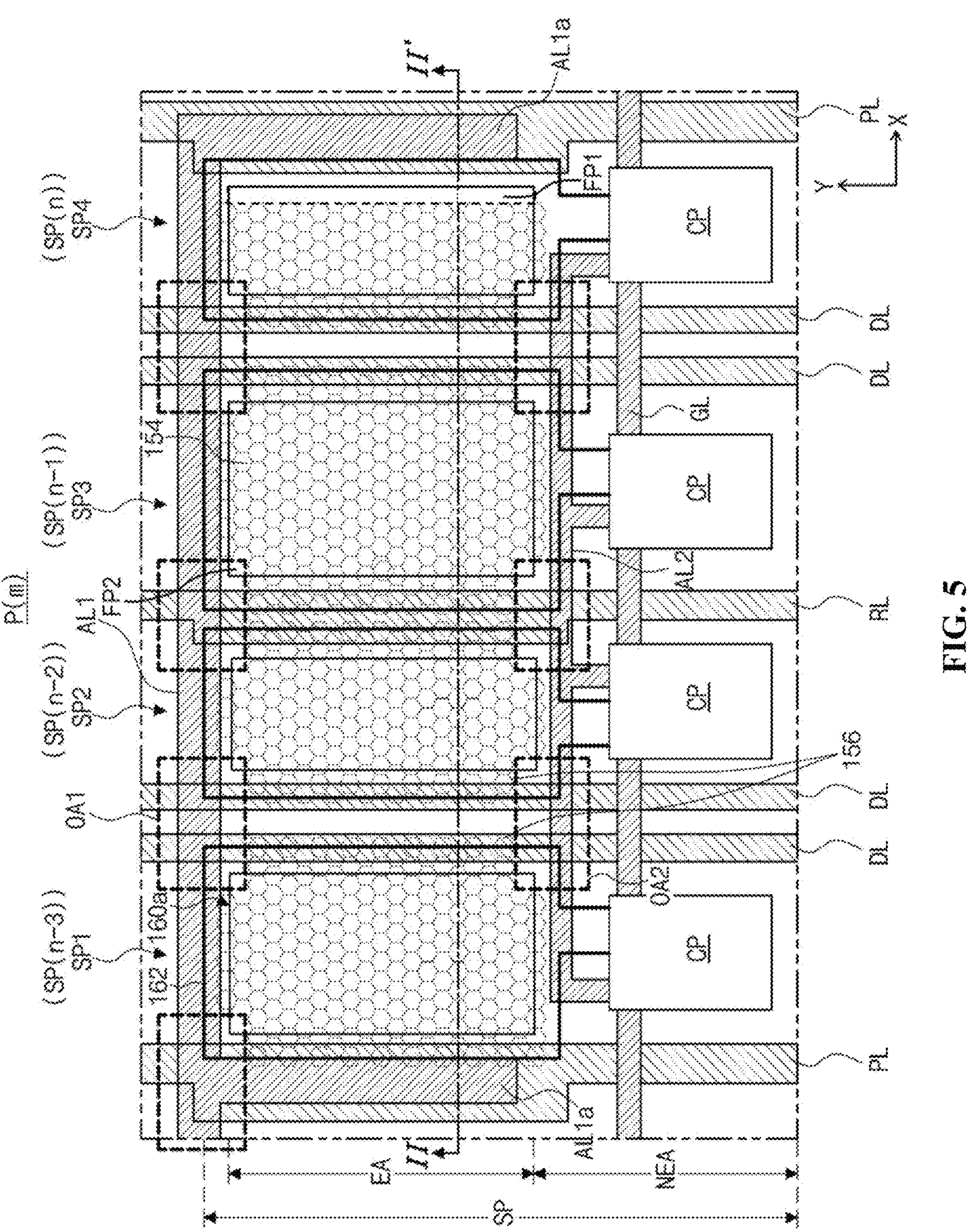
FIG. 5 is a schematic plan view of an mth pixel of an organic light-emitting diode display device according to the first example embodiment of the present disclosure.
Figure 6:
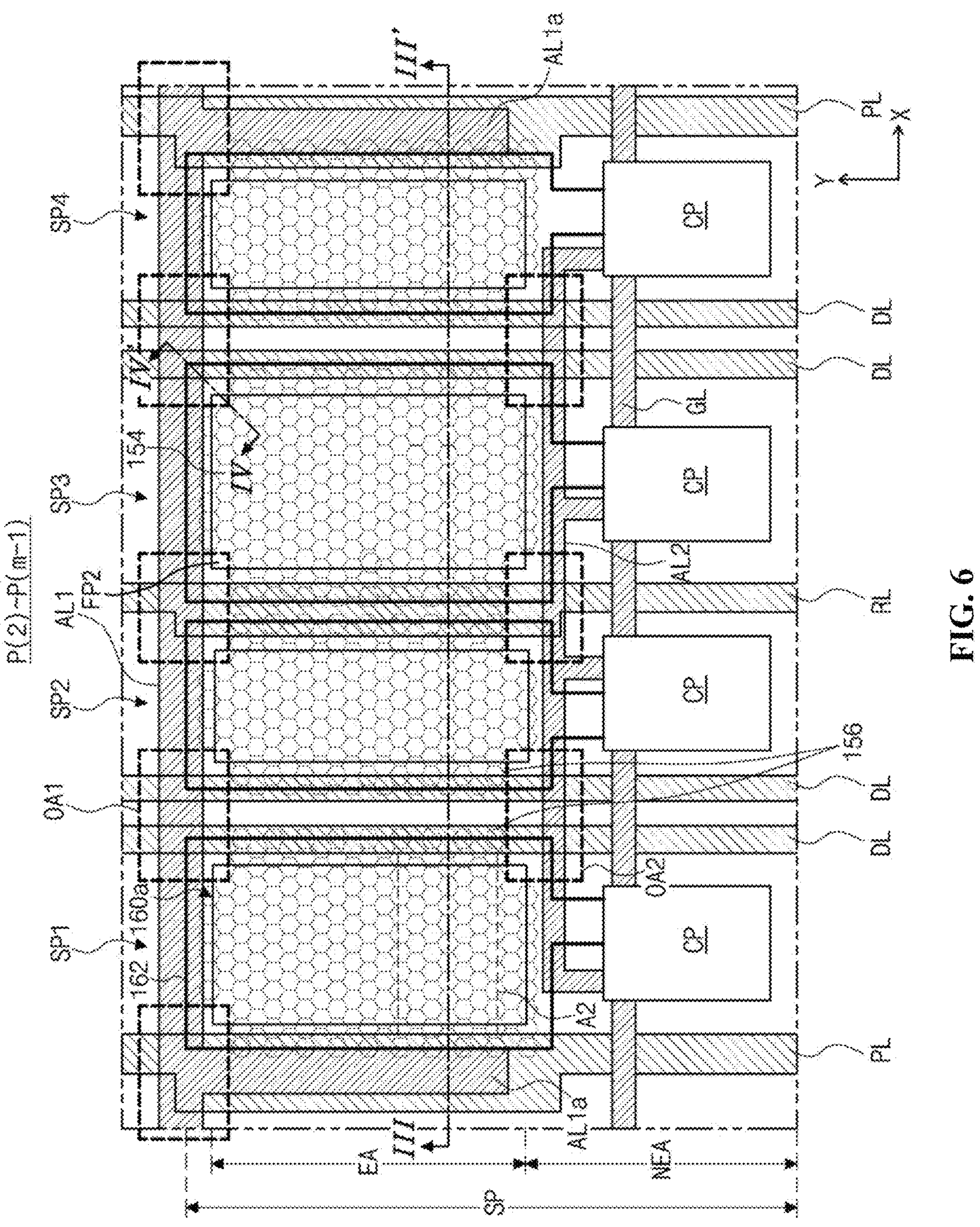
FIG. 6 is a schematic plan view of one of a second pixel to an (m−1)th pixel of an organic light-emitting diode display device according to the first example embodiment of the present disclosure.

FIGS. 4 to 6 are schematic plan views of an organic light-emitting diode display device according to the first example embodiment of the present disclosure. FIG. 4 shows a first pixel, FIG. 5 shows an mth pixel, and FIG. 6 shows one of a second pixel to an (m−1)th pixel. An organic light-emitting diode display device according to the first example embodiment of the present disclosure is described in more detail with reference to FIGS. 1 to 3 and FIGS. 4 to 6.

As shown in FIGS. 4 to 6, in the organic light-emitting diode display device according to the first example embodiment of the present disclosure, a gate line GL, as a horizontal line, can extend along the first direction, which is the X direction, and data lines DL, power lines PL, and reference lines RL, as vertical lines, can extend along the second direction, which is the Y direction. The gate line GL can cross the data lines DL, the power lines PL, and the reference lines RL to thereby define the plurality of sub-pixels SP. Here, the power lines PL can be the high potential line supplying the high potential voltage EVDD of FIG. 1.

In one or more aspects, a horizontal line (e.g., a gate line GL) may be sometimes referred to as a line, a first line, a second line, a horizontal conductive line, a conductive line, a first conductive line, a second conductive line, a signal or power line, a first signal or power line, or a second signal or power line, and vice versa. In one or more aspects, a vertical line (e.g., a data line DL, a power line PL, or a reference line RL) may be sometimes referred to as a line, a second line, a first line, a vertical conductive line, a conductive line, a second conductive line, a first conductive line, a signal or power line, a second signal or power line, or a first signal or power line, and vice versa.

Here, one reference line RL can be disposed between two power lines PL, two data lines DL can be disposed between one power line PL and one reference line RL, and each sub-pixel SP can be disposed substantially between one power line PL and one adjacent data line DL or between one reference line RL and one adjacent data line DL.

Each sub-pixel SP can have substantially a rectangular shape. However, embodiments of the present disclosure are not limited thereto, and the shape of each sub-pixel SP can be changed.

As described above, one pixel can include a plurality of such sub-pixels SP. For example, one pixel can include four sub-pixels SP, for example, first, second, third, and fourth sub-pixels SP1, SP2, SP3, and SP4.

The first, second, third, and fourth sub-pixels SP1, SP2, SP3, and SP4 can be sequentially arranged along the first direction. Here, the first sub-pixel SP1 can be a red sub-pixel, the second sub-pixel SP2 can be a blue sub-pixel, the third sub-pixel SP3 can be a white sub-pixel, and the fourth sub-pixel SP4 can be a green sub-pixel. However, embodiments of the present disclosure are not limited to the foregoing. Alternatively, the number of sub-pixels included in one pixel or the arrangement order of the red, green, blue, and white sub-pixels can be changed.

The areas or sizes of the first, second, third, and fourth sub-pixels SP1, SP2, SP3, and SP4 can be different from each other. For example, the areas of the first and third sub-pixels SP1 and SP3 can be larger than the areas of the second and fourth sub-pixels SP2 and SP4. In addition, the area of the third sub-pixel SP3 can be equal to or larger than the area of the first sub-pixel SP1, and the area of the second sub-pixel SP2 can be equal to or larger than the area of the fourth sub-pixel SP4. However, embodiments of the present disclosure are not limited to the foregoing. Alternatively, all areas or sizes of the first, second, third, and fourth sub-pixels SP1, SP2, SP3, and SP4 can be the same or substantially the same.

Here, one power line PL, two data lines DL, or one reference line RL can be disposed substantially between adjacent two of the sub-pixels SP1, SP2, SP3, and SP4. For example, two data lines DL can be disposed between the first and second sub-pixels SP1 and SP2 and between the third and fourth sub-pixels SP3 and SP4, one reference line RL can be disposed between the second and third sub-pixels SP2 and SP3, and one power line PL can be disposed between the first sub-pixel SP1 and the fourth sub-pixel SP4 of a previous pixel or between the fourth sub-pixel SP4 and the first sub-pixel SP1 of a next pixel. Accordingly, one pixel P can be disposed between the adjacent power lines PL. However, embodiments of the present disclosure are not limited to the foregoing.

In addition, a first auxiliary line AL1 and a second auxiliary line AL2, as horizontal lines, can be further disposed along the first direction. The first auxiliary line AL1 and the second auxiliary line AL2 can be parallel to the gate line GL and can cross and overlap at least one of the power lines PL, the data lines DL, and the reference lines RL.

The first auxiliary line AL1 can be disposed at an upper end of each sub-pixel SP and can extend from an initial sub-pixel SP(1), which is a first sub-pixel SP1 of a first pixel P(1), to a last nth sub-pixel SP(n), which may be a fourth sub-pixel SP4 of an mth pixel P(m), in the context of the figures. The first auxiliary line AL1 can cross the power lines PL, the data lines DL, and the reference lines RL. Accordingly, the first auxiliary line AL1 can overlap the power lines PL, the data lines DL, and the reference lines RL, so first overlap portions OA1 can be provided.

The second auxiliary line AL2 can be disposed along the first direction between the gate line GL and the first auxiliary line AL1 and can extend from a first sub-pixel SP1 to a fourth sub-pixel SP4 of each pixel P. The second auxiliary line AL2 can cross the data lines DL and the reference line RL. Accordingly, the second auxiliary line AL2 can overlap the data lines DL and the reference line RL, so second overlap portions OA2 can be provided.

Meanwhile, the second auxiliary line AL2 can be spaced apart from the power lines PL. However, embodiments of the present disclosure are not limited to the foregoing.

The first auxiliary line AL1 can be electrically connected to the power lines PL. The second auxiliary line AL2 can be electrically connected to a circuit portion CP and can also be electrically connected to the reference line RL. However, embodiments of the present disclosure are not limited to the foregoing.

The first auxiliary line AL1 can include an auxiliary pattern AL1*a*. The auxiliary pattern AL1*a* can extend in the second direction and overlap the corresponding power line PL. A width of the auxiliary pattern AL1*a* along the first direction can be smaller than a width of the corresponding power line PL. Two sides of the auxiliary pattern AL1*a* can be disposed over the corresponding power line PL.

Each sub-pixel SP can include the emission area EA and the non-emission area NEA. The light-emitting diode De of FIG. 1 can be provided in the emission area EA, and the circuit portion CP can be provided in the non-emission area NEA. The light-emitting diode De can include the first electrode 162, which is an anode, and the circuit portion CP can include the first, second, and third transistors T1, T2, and T3 and the storage capacitor Cst of FIG. 1.

The first electrode 162 can extend into the non-emission area NEA and can be electrically connected to the circuit portion CP. More particularly, the first electrode 162 can be electrically connected to the second transistor T2 of the circuit portion CP.

The emission area EA can be defined by the opening 160*a* of the bank (e.g., 160 in FIG. 2) exposing the first electrode 162. The opening 160*a* of the bank can have a smaller area than the first electrode 162 and can be disposed within the edges of the first electrode 162.

Here, each of the power lines PL, the data lines DL, and the reference lines RL can overlap the first electrode 162 corresponding thereto and can be spaced apart from the opening 160*a* of the bank corresponding thereto. In this case, each of the power lines PL and the reference lines RL can include a portion overlapping the first electrode 162, which has a wider width than other portions of the corresponding power line PL or reference line RL. However, embodiments of the present disclosure are not limited to the foregoing.

In addition, each of the first auxiliary line AL1 and the second auxiliary line AL2 can overlap the first electrodes 162 corresponding thereto and can be spaced apart from the openings 160*a* of the bank corresponding thereto.

A plurality of micro lenses 154 can be provided in the emission area EA of each sub-pixel SP. The micro lenses 154 can be placed inside the opening 160*a* of the bank but also outside the opening 160*a* and can overlap the bank. In this case, a part of the micro lens 154 can overlap the bank.

Meanwhile, the micro lenses 154 can overlap the first electrode 162 and can be spaced apart from the edges of the first electrode 162 without overlapping.

In addition, the micro lenses 154 can overlap at least one of the first auxiliary line AL1 and the second auxiliary line AL2. In the first example embodiment of the present disclosure, although the micro lenses 154 are shown as overlapping the first auxiliary line AL1 and being spaced apart from the second auxiliary line AL2, embodiments of the present disclosure are not limited thereto. Alternatively, the micro lenses 154 can overlap both the first auxiliary line AL1 and the second auxiliary line AL2.

The micro lenses 154 can have a hexagonal shape in plan and can form a honeycomb structure. Alternatively, the micro lenses 154 can have a circular shape, an oval shape, a rectangular shape, or the like.

At least one dummy lens 156 can be provided outside the opening 160*a* of each sub-pixel SP. That is, the dummy lens 156 can be provided in the non-emission area NEA between the emission areas EA.

The dummy lens 156 can be spaced apart from the opening 160*a* and can completely overlap the bank. In addition, the dummy lens 156 can overlap the line (e.g., the power line PL, the data line DL, and the reference line RL) adjacent thereto.

Here, the dummy lens 156 can be provided only on left and right sides of the opening 160*a*, that is, opposite sides facing each other along the first direction (e.g., an X direction), and may not be provided on upper and lower sides of the opening 160*a*, that is, opposite sides facing each other along the second direction (e.g., a Y direction). Accordingly, the dummy lens 156 can overlap left and right edges of the first electrode 162 facing each other along the first direction and can be spaced apart from upper and lower edges of the first electrode 162 facing each other along the second direction.

The dummy lens 156 can have the same size and shape as the micro lenses 154. That is, the dummy lens 156 can have a hexagonal shape in plan. Alternatively, the dummy lens 156 can have a size and shape different from the micro lenses 154. For example, the size of the dummy lens 156 can be larger than that of the micro lenses 154. However, embodiments of the present disclosure are not limited to the foregoing.

The dummy lens 156 can prevent vertical stripe-shaped stains due to the bank. Specifically, the dummy lens 156 can function as a dam in which a bank material is pre-filled in the process of forming the bank, so that the bank material can be uniformly spread. Accordingly, the bank material can be prevented from flowing into the opening 160*a* and filling the micro lenses 154 unevenly, and it is possible to improve the vertical stripe-shaped stains.

In addition, as described above, the dummy lens 156 can be provided only on the left and right sides of the opening 160*a* and may not be provided on the upper and lower sides of the opening 160*a*. This is to prevent the dummy lens 156 from being placed at a repair point during a repair process due to a defect so that an electrical short circuit may not occur.

Meanwhile, in the outermost sub-pixel at the left short side of the display area DA, that is, the initial sub-pixel SP(1), which is the first sub-pixel SP1 of the first pixel P(1), the micro lenses 154 can be spaced apart from the edge of the opening 160*a* adjacent to the power line PL, that is, a left edge of the opening 160*a* without overlapping. Further, in the initial sub-pixel SP(1), the dummy lens 156 may not be provided on the left side of the opening 160*a*.

Accordingly, the emission area EA of the initial sub-pixel SP(1) can have a first flat portion FP1 where the micro lenses 154 are removed. The first flat portion FP1 can be provided only on the left side of the initial sub-pixel SP(1).

In the same manner, in the outermost sub-pixel at the right short side of the display area DA, that is, the last nth sub-pixel SP(n), which may be the fourth sub-pixel SP4 of the mth pixel P(m), the micro lenses 154 can be spaced apart from the edge of the opening 160*a* adjacent to the power line PL, that is, a right edge of the opening 160*a* without overlapping. Further, in the last nth sub-pixel SP(n), the dummy lens 156 may not be provided on the right side of the opening 160*a*.

Accordingly, the emission area EA of the last nth sub-pixel SP(n) can have a first flat portion FP1 where the micro lenses 154 are removed. The first flat portion FP1 can be provided only on the right side of the last nth sub-pixel SP(n).

Additionally, in each sub-pixel SP, the micro lenses 154 may not be provided in the first and second overlap portions OA1 and OA2. In the first and second overlap portions OA1 and OA2, the overcoat layer (e.g., 150 in FIG. 2) can be formed with a relatively thin thickness due to a double step difference between two lines overlapping each other. Thus, the overcoat layer and the passivation layer (e.g., 140 in FIG. 2) corresponding to the micro lenses 154 in the first and second overlap portions OA1 and OA2 may be lost during the ashing process, and an electrical short circuit may occur between the first electrode 162 and the lines, resulting in bright spot defects.

Accordingly, to prevent the defects, the micro lenses 154 may not be placed in the first and second overlap portions OA1 and OA2. Therefore, the micro lenses 154 can be spaced apart from the edges of the opening 160*a* corresponding to (or at or near) the first and second overlap portions OA1 and OA2, that is, corners of the opening 160*a* without overlapping. Additionally, in each sub-pixel SP, the dummy lens 156 may not be provided in the first and second overlap portions OA1 and OA2.

The emission area EA of each of the plurality of sub-pixels SP can have a plurality of second flat portions FP2 where the micro lenses 154 are removed at the corners thereof.

As such, in the organic light-emitting diode display device according to the first example embodiment of the present disclosure, the micro lenses 154 can be disposed to be spaced apart from the edge of the opening 160*a* adjacent to the power line PL in each of the initial sub-pixel SP(1) and the last nth sub-pixel SP(n) placed at the left and right edge sides of the display area DA. Accordingly, the emission area EA of each of the outermost sub-pixels SP(1) and SP(n) at the left and right short sides of the display area DA can include the first flat portion FP1 where the micro lenses 154 are removed.

Meanwhile, the dummy lenses 156 can be provided outside of the opening 160*a* of each sub-pixel SP, so that the vertical stripe-shaped stains can be improved, but in each of the initial sub-pixel SP(1) and the last nth sub-pixel SP(n), the dummy lenses 156 may not be provided on or at the edge side of the opening 160*a* adjacent to the power line PL.

Moreover, in each sub-pixel SP, the micro lenses 154 can be disposed to be spaced apart from the corners of the opening 160*a* corresponding to the first and second overlap portions OA1 and OA2. Further, the dummy lenses 156 may not be provided in the first and second overlap portions OA1 and OA2. Accordingly, the emission area EA of each of the plurality sub-pixels SP can include the second flat portions FP2 where the micro lenses 154 are removed corresponding to the first and second overlap portions OA1 and OA2.

Although one outermost sub-pixel SP(1) and one outermost sub-pixel SP(n) are shown in FIG. 4 and FIG. 5, respectively, embodiments of the present disclosure are not limited thereto. All sub-pixels of a first column at each of the left and right sides of the display area DA can have the first flat portion FP1 in the emission area EA.

Specifically, all sub-pixels of the first column at the left side of the display area DA can have the first flat portion FP1 on its left side, and all sub-pixels of the last column at the right side of the display area DA can have the first flat portion FP1 on its right side. An area provided with the first flat portion FP1 is a double step difference area where the power line PL and the first auxiliary line AL1 overlap each other.

The cross-sectional structure of the organic light-emitting diode display device according to the first example embodiment of the present disclosure is described in more detail with reference to FIGS. 7 to 10.

Figure 7:
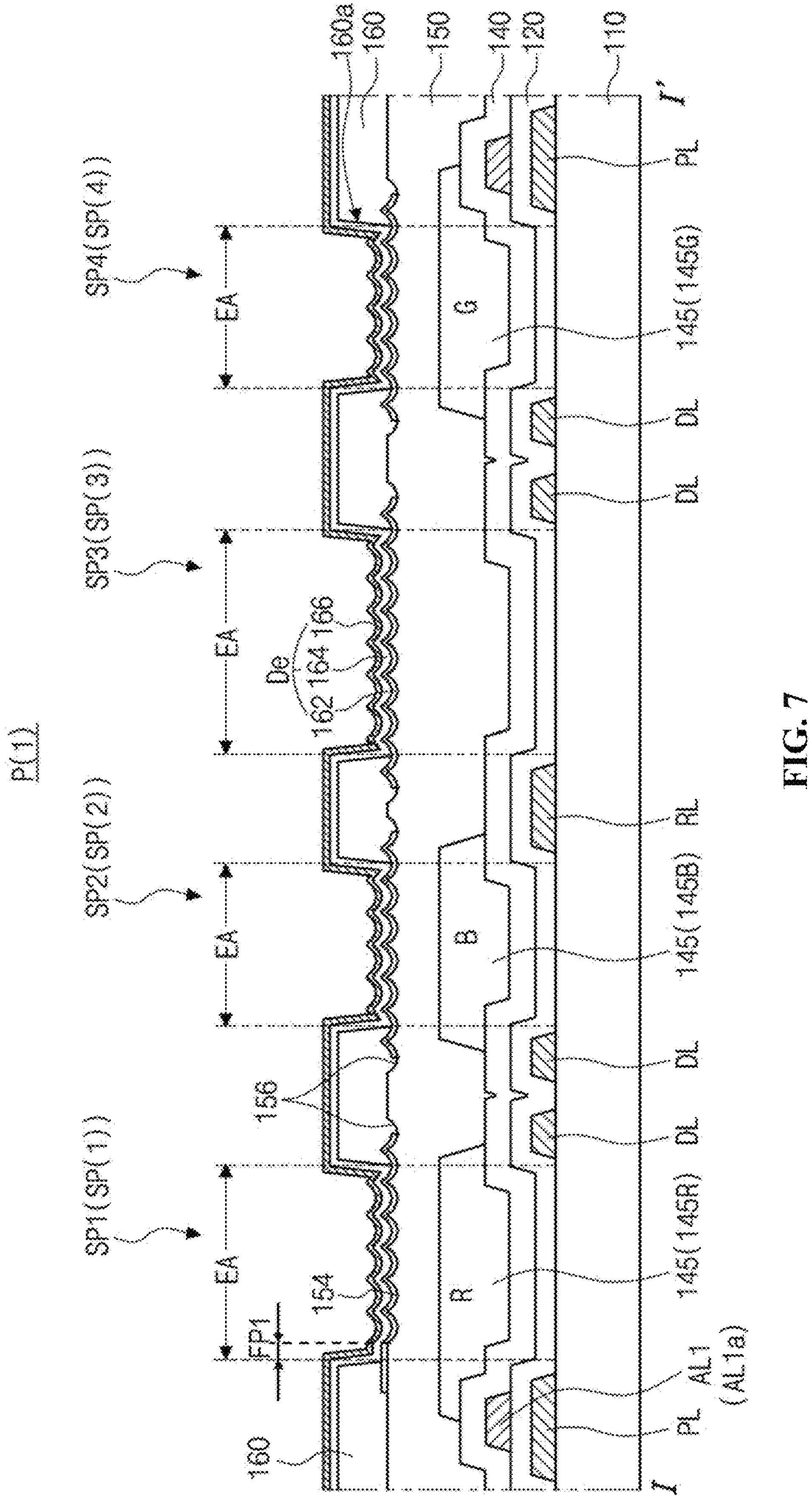
FIG. 7 is an example of a cross-sectional view corresponding to the line I-I' of FIG. 4.
Figure 8:
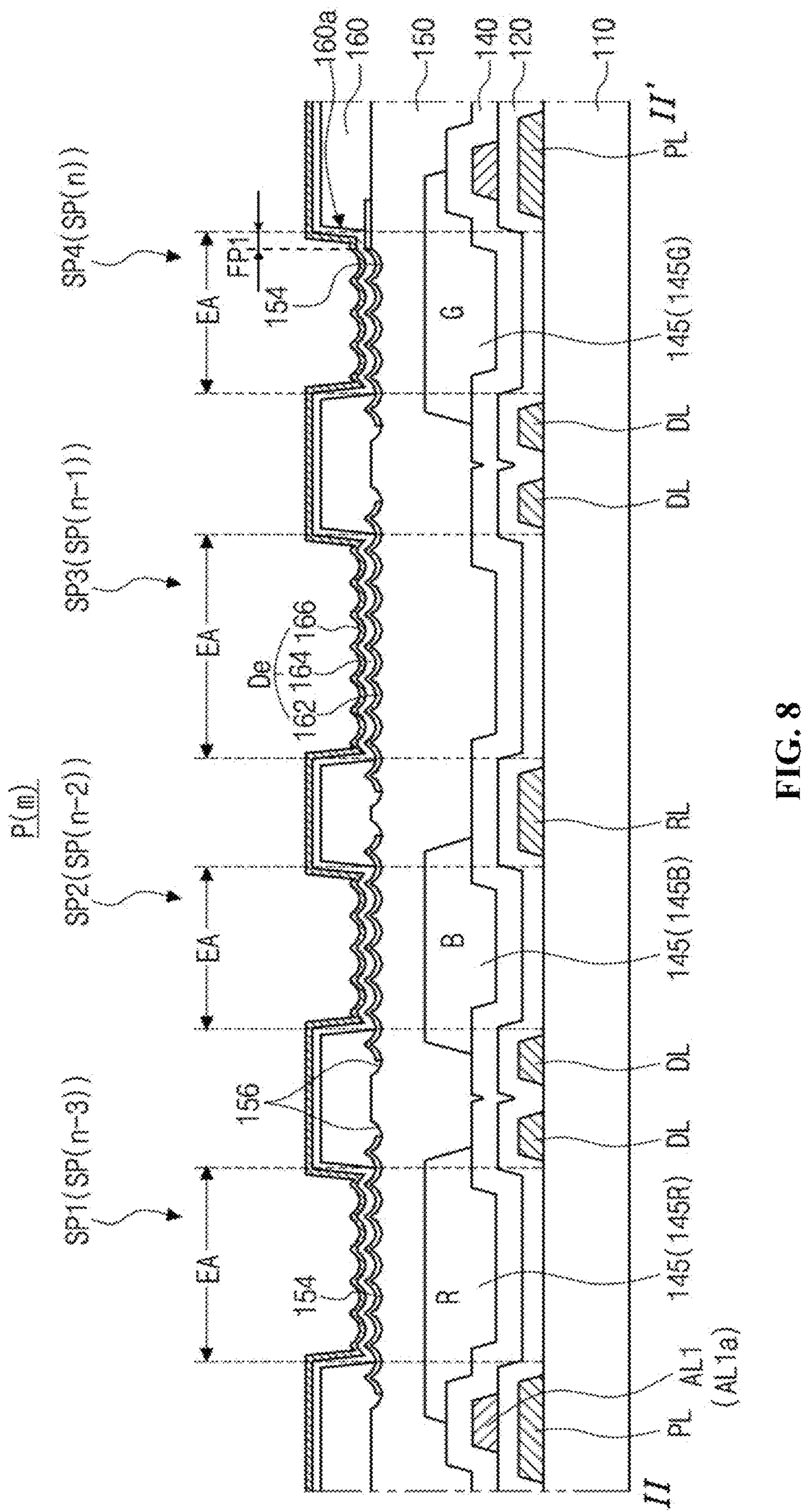
FIG. 8 is an example of a cross-sectional view corresponding to the line II-II' of FIG. 5.
Figure 9:
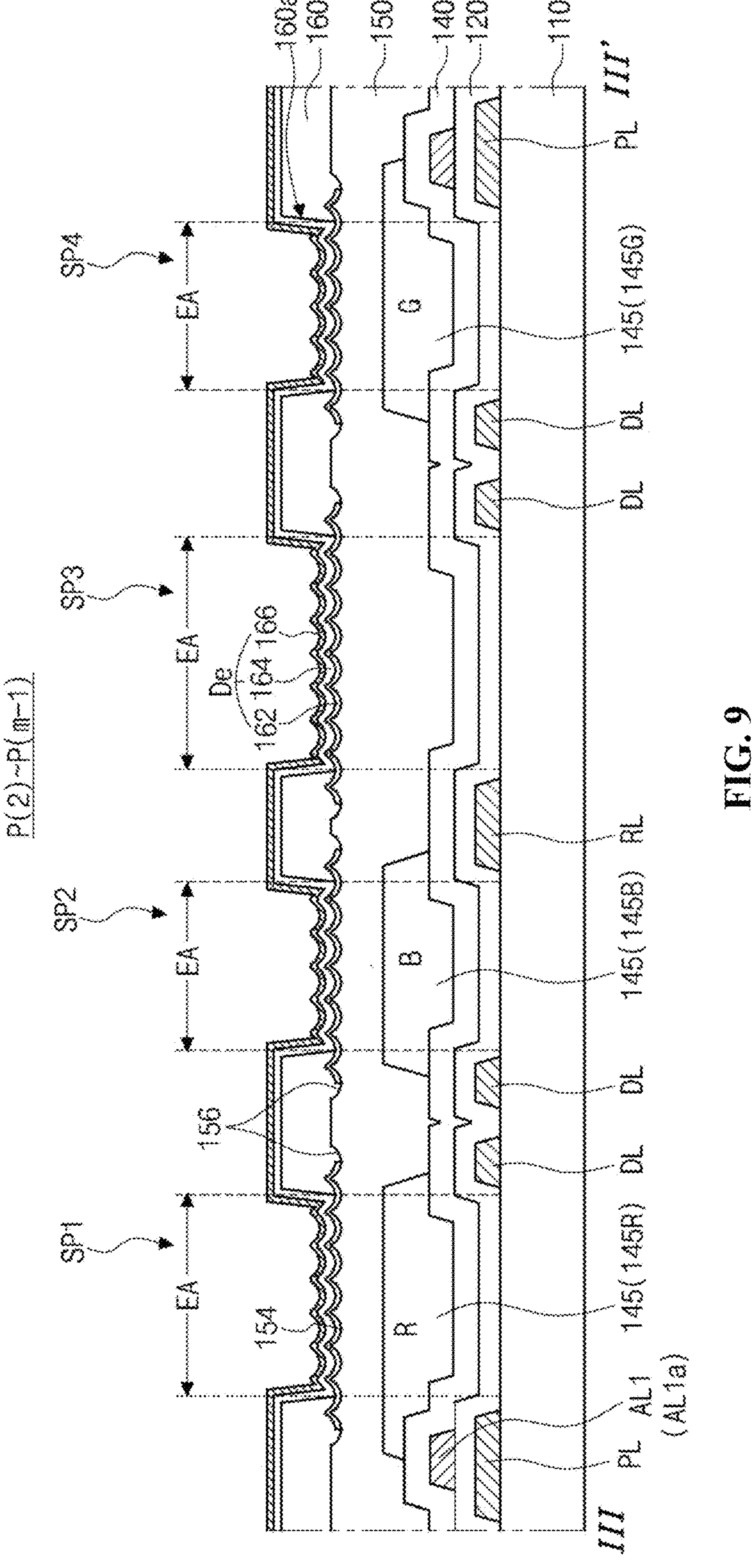
FIG. 9 is an example of a cross-sectional view corresponding to the line III-III' of FIG. 6.
Figure 10:
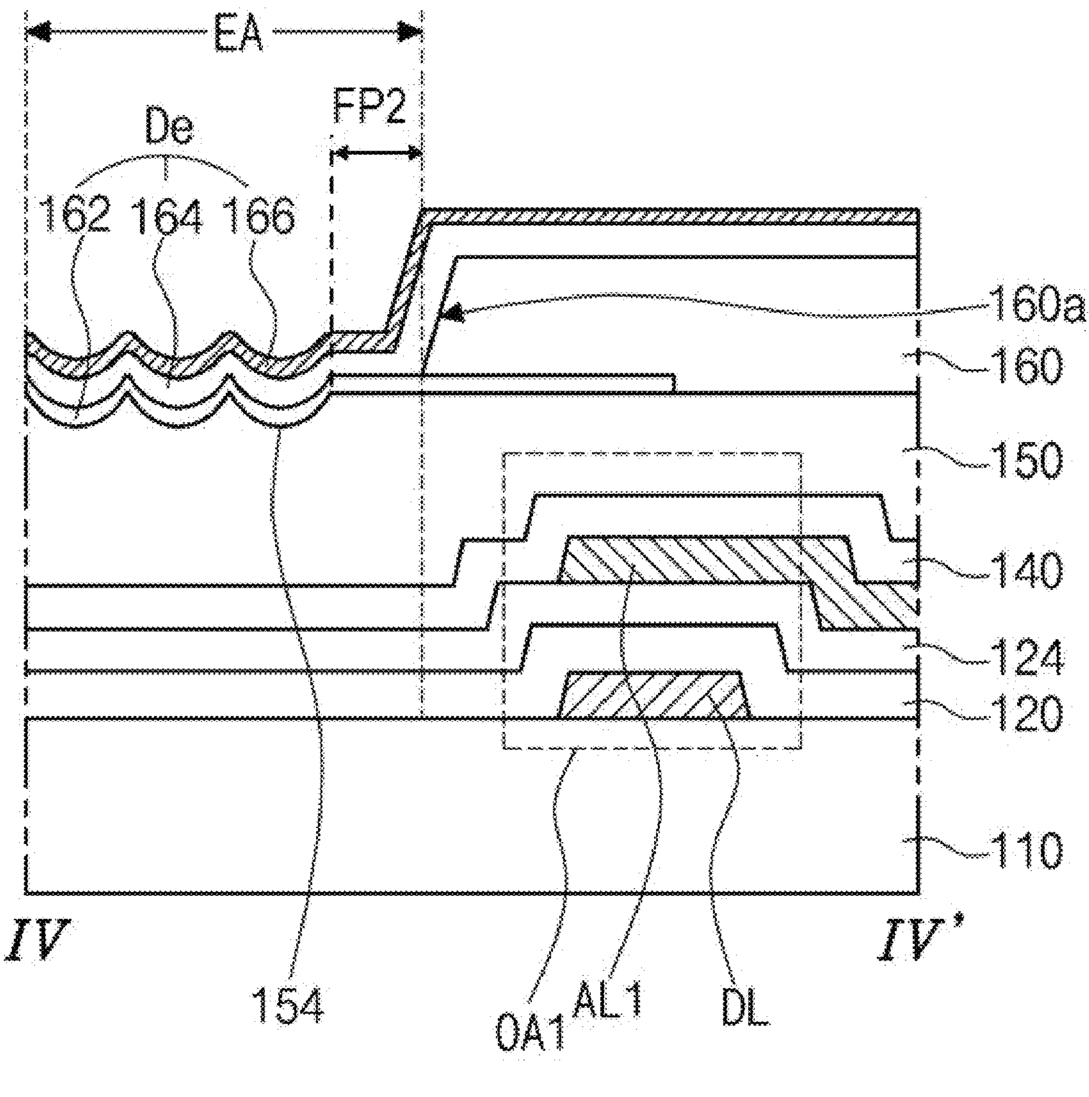
FIG. 10 is an example of a cross-sectional view corresponding to the line IV-IV' of FIG. 6.

FIG. 7 is an example of a cross-sectional view corresponding to the line I-I' of FIG. 4, FIG. 8 is an example of a cross-sectional view corresponding to the line II-II' of FIG. 5, FIG. 9 is an example of a cross-sectional view corresponding to the line III-III' of FIG. 6, and FIG. 10 is an example of a cross-sectional view corresponding to the line IV-IV' of FIG. 6. FIGS. 7 to 10 are described in more detail with reference to FIGS. 2 to 6 together.

In FIGS. 7 to 10, the organic light-emitting diode display device according to the first example embodiment of the present disclosure can include a plurality of sub-pixels, for example, the first, second, third, and fourth sub-pixels SP1, SP2, SP3, and SP4. The power lines PL, the data lines DL, and the reference line RL, which are (or are formed of) a first conductive layer, can be placed over the substrate 110. The buffer layer 120 can be placed over the power lines PL, the data lines DL, and the reference line RL. The gate line GL, the first auxiliary line AL1, and the second auxiliary line AL2, which are (or are formed of) a second conductive layer, can be placed over the buffer layer 120. In one or more aspects, the light-shielding layer 112 of FIG. 2 can be the first conductive layer. In one or more aspects, the gate electrode 126 and the source and drain electrodes 132 and 134 of FIG. 2 can be the second conductive layer.

In one or more aspects, the power lines PL, the data lines DL, the reference line RL, and the light-shielding layer 112 of FIG. 2 can be formed of a same layer and a same material. In one or more aspects, the gate line GL, the first auxiliary line AL1, the second auxiliary line AL2, the gate electrode 126, and the source and drain electrodes 132 and 134 of FIG. 2 can be formed of a same layer and a same material.

Here, as shown in FIG. 10, the gate insulation layer 124 can be further provided between the buffer layer 120 and the second conductive layer, more particularly, between the buffer layer 120 and each of the gate line GL, the first auxiliary line AL1, and the second auxiliary line AL2. The gate insulation layer 124 can be disposed over substantially the entire surface of the substrate 110.

The gate line GL, the first auxiliary line AL1, and the second auxiliary line AL2 can cross and overlap at least one of the power line PL, the data lines DL, and the reference line RL. The first auxiliary line AL1 can include the auxiliary pattern AL1*a*, which can be disposed over and overlap the power line PL.

The passivation layer 140 can be placed over the gate line GL, the first auxiliary line AL1, and the second auxiliary line AL2.

Next, the color filter 145 can be placed over the passivation layer 140 corresponding to the emission area EA. Here, the color filter 145 can be extended into the non-emission area NEA.

The color filter 145 can include red, green, and blue color filters 145R, 145G, and 145B. The red color filter 145R can be disposed in the first sub-pixel SP1, the blue color filter 145B can be disposed in the second sub-pixel SP2, and the green color filter 145G can be disposed in the fourth sub-pixel SP4. In this example, no color filter is disposed in the third sub-pixel SP3 which can be a white sub-pixel. Accordingly, the first, second, third, and fourth sub-pixels SP1, SP2, SP3, and SP4 can output red light, blue light, white light, and green light, respectively.

The color filter 145 can overlap the signal lines adjacent thereto. For instance, the red color filter 145R can overlap one power line PL and one data line DL, the blue color filter 145B can overlap another data line DL and the reference line RL, and the green color filter 145G can overlap another data line DL and another power line PL. In addition, each of the red color filter 145R and the green color filter 145G can overlap the auxiliary pattern AL1*a* of the first auxiliary line AL1 adjacent thereto.

Although the red, blue, and green color filters 145R, 145B, and 145G are shown as being spaced apart from each other, embodiments of the present disclosure are not limited thereto. Adjacent ones of red, blue, and green color filters 145R, 145B, and 145G can overlap each other. For example, the adjacent red and blue color filters 145R and 145B can overlap each other, and the adjacent green and red color filter 145G and 145R can overlap each other.

The overcoat layer 150 can be placed over the color filter 145. The overcoat layer 150 can have the plurality of micro lenses 154 at the top surface thereof in the emission area EA of each sub-pixel SP1, SP2, SP3, and SP4. In the first, second, and fourth sub-pixels SP1, SP2, and SP4, the micro lenses 154 can overlap the color filter 145. Each micro lens 154 can include the depressed portion, and adjacent portions of two or more micro lenses 154 can form the embossed portion.

Meanwhile, in each of the outermost sub-pixel at the left short side of the display area DA and the outermost sub-pixel at the right short side of the display area DA, that is, in each of the initial sub-pixel SP(1) (which is a first sub-pixel SP1 of a first pixel P(1)) and the last nth sub-pixel SP(n) (which may be a fourth sub-pixel SP4 of an mth pixel P(m)), the micro lenses 154 can be spaced apart from the power line PL adjacent thereto without overlapping. Additionally, in the initial sub-pixel SP(1) and the last nth sub-pixel SP(n), the micro lenses 154 can also be spaced apart from the auxiliary pattern AL1*a* of the first auxiliary line AL1 over the power line PL without overlapping.

Accordingly, the emission area EA of each of the initial sub-pixel SP(1) and the last nth sub-pixel SP(n) can have the first flat portion FP1 where the micro lenses 154 are removed. In the first flat portion FP1, the overcoat layer 150 can have the flat top surface.

In the non-display area NEA of each sub-pixel SP1, SP2, SP3, and SP4, the dummy lenses 156 can be provided at the top surface of the overcoat layer 150. The dummy lenses 156 can have the same size and shape as the micro lenses 154. In the first, second, and fourth sub-pixels SP1, SP2, and SP4, the dummy lenses 156 can overlap the color filter 145.

In each sub-pixel SP1, SP2, SP3, and SP4, the dummy lenses 156 can be disposed over and overlap the signal lines PL, DL, and RL adjacent thereto. On the other hand, in each of the initial sub-pixel SP(1) and the last nth sub-pixel SP(n), the dummy lenses 156 may not be disposed over the power line PL adjacent thereto. Accordingly, in each of the initial sub-pixel SP(1) and the last nth sub-pixel SP(n), the overcoat layer 150 over the power line PL can have the flat top surface.

Meanwhile, as shown in FIG. 10, in each sub-pixel SP1, SP2, SP3, and SP4, the micro lenses 154 can be spaced apart from two signal lines DL and AL1 overlapping each other without overlapping. Namely, in each sub-pixel SP1, SP2, SP3, and SP4, the micro lenses 154 can be spaced apart from the first and second overlap portions OA1 and OA2. Further, in each sub-pixel SP1, SP2, SP3, and SP4, the dummy lenses 156 may not be provided over the first and second overlap portions OA1 and OA2.

Accordingly, the emission area EA of each sub-pixel SP1, SP2, SP3, and SP4 can have the second flat portion FP2 where the micro lenses 154 are removed at its corner. The second flat portion FP2 can be provided to correspond to the first and second overlap portions OA1 and OA2. Stated in another way, in one or more aspects, a second flat portion FP2 can be provided at or near each of the corresponding first and second overlap portions OA1 and OA2. Further, the overcoat layer 150 can have the flat top surface in the second flat portion FP2.

Next, the first electrode 162 of the light-emitting diode De can be placed over the overcoat layer 150 in each of the first, second, third, and fourth sub-pixels SP1, SP2, SP3, and SP4. The first electrode 162 can overlap the signal lines adjacent thereto.

In addition, the first electrode 162 can overlap and cover the micro lenses 154.

On the other hand, the first electrode 162 can partially overlap at least one of the dummy lenses 156. Accordingly, an edge of a first electrode 162 can be disposed over and within a dummy lens 156. However, embodiments of the present disclosure are not limited to the foregoing.

The bank 160 can be provided over the first electrode 162. The bank 160 can have the opening 160*a* corresponding to the emission area EA of each sub-pixel SP1, SP2, SP3, and SP4. The first electrode 162 can be exposed through the opening 160*a*.

The opening 160*a* of the bank 160 can define the emission area EA, and the width and area of the opening 160*a* can be substantially the same as the width and area of the emission area EA.

The bank 160 can overlap the micro lenses 154 in each of the first, second, third, and fourth sub-pixels SP1, SP2, SP3, and SP4. In this case, the bank 160 can overlap a portion of the micro lens 154.

In addition, the bank 160 can overlap and cover the dummy lenses 156. Accordingly, the opening 160*a* of the bank 160 can be spaced apart from the dummy lenses 156. In this case, at least one dummy lens 156 can completely overlap the bank 160 and be entirely covered by the bank 160.

Meanwhile, in each of the initial sub-pixel SP(1) and the last nth sub-pixel SP(n), an outer edge of the opening 160*a* of the bank 160, that is, the edge of the opening 160*a* of the bank 160 corresponding to (or at or near) the power line PL can be spaced apart from the micro lenses 154. Accordingly, in each of the initial sub-pixel SP(1) and the last nth sub-pixel SP(n), the side surface of the bank 160 corresponding to the power line PL can be spaced apart from the micro lenses 154 and be disposed over the flat top surface of the overcoat layer 150. Further, in each of the initial sub-pixel SP(1) and the last nth sub-pixel SP(n), the bank 160 corresponding to the power line PL may not overlap the dummy lenses 156.

In addition, as shown in FIG. 10, in each sub-pixel SP1, SP2, SP3, and SP4, the edge of the opening 160*a* of the bank 160 corresponding to the first and second overlap portions OA1 and OA2 can be spaced apart from the micro lenses 154. Accordingly, in each sub-pixel SP1, SP2, SP3, and SP4, the side surface of the bank 160 corresponding to the first and second overlap portions OA1 and OA2 can be spaced apart from the micro lenses 154 and be disposed over the flat top surface of the overcoat layer 150. Moreover, in each sub-pixel SP1, SP2, SP3, and SP4, the bank 160 corresponding to the first and second overlap portions OA1 and OA2 may not overlap the dummy lenses 156.

Next, the light-emitting layer 164 of the light-emitting diode De can be placed over the first electrode 162 and the bank 160. The light-emitting layer 164 can be disposed over substantially the entire surface of the substrate 110. The light-emitting layer 164 can emit white light and can have a stack structure, which includes light-emitting units emitting different colors.

The second electrode 166 can be placed over the light-emitting layer 164. The second electrode 166 can be disposed over substantially the entire surface of the substrate 110.

The first electrode 162, the second electrode 166, and the light-emitting layer 164 interposed therebetween can constitute the light-emitting diode De.

As described above, the overcoat layer 150 can have the micro lenses 154 at its top surface in the emission area EA. The first electrode 162, the light-emitting layer 164, and the second electrode 166 disposed over the overcoat layer 150 can be formed along the morphology or contour of the top surface of the overcoat layer 150. Accordingly, the first electrode 162, the light-emitting layer 164, and the second electrode 166 can also have the micro lens shape at the respective top surfaces in the emission area EA, and the micro lenses 154 can change the progress path of light, thereby improving the light extraction efficiency.

As such, in the organic light-emitting diode display device according to the first example embodiment of the present disclosure, by placing the micro lenses 154 to be spaced apart from the edge of the opening 160*a* adjacent to the power line PL in each of the initial sub-pixel SP(1) and the last nth sub-pixel SP(n) disposed on the left and right edges of the display area DA, each of the outermost sub-pixels SP(1) and SP(n) at the left and right short sides of the display area DA can have the first flat portion FP1 in the emission area EA, so that the loss of the overcoat layer 150 and the passivation layer 140 can be prevented during the ashing process for forming the micro lenses 154. Accordingly, the electrical short circuit between the first electrode 162 and the power line PL can be prevented, and thus the bright spot defects can be prevented, thereby improving the image quality of the display device.

Further, in each of the initial sub-pixel SP(1) and the last nth sub-pixel SP(n), the dummy lenses 156 may not be provided on or at the edge side of the opening 160*a* adjacent to the power line PL.

Additionally, in each sub-pixel SP, by placing the micro lenses 154 to be spaced apart from the corners of the opening 160*a* corresponding to the first and second overlap portions OA1 and OA2, the emission area EA of each sub-pixel can have the second flat portions FP2 at its corners, and it is possible to prevent the loss of the overcoat layer 150 and the passivation layer 140 due to the double step difference resulting from cross and overlap between the vertical lines PL, DL, and RL and the horizontal lines AL1 and AL2. Accordingly, the electrical short circuit between the first electrode 162 and the signal lines thereunder can be prevented, and thus the bright spot defects can be prevented, thereby improving the image quality of the display device.

Further, the dummy lenses 156 may not be provided in the first and second overlap portions OA1 and OA2.

Meanwhile, the pixels and the sub-pixels of one row arranged along the first direction may be described according to the above example embodiment, but embodiments of the present disclosure are not limited thereto. Namely, the pixels and the sub-pixels of the same column arranged along the second direction can have substantially the same structures as those illustrated with respect to FIGS. 4 to 10 as well as those illustrated below with respect to FIGS. 11 to 14. In other words, in one or more aspects, the pixels and sub-pixels of one row described, with respect to FIGS. 4 to 10 as well as with respect to FIGS. 11 to 14, may have substantially the same structures as the pixels and sub-pixels of each of the other rows in the display area DA. For example, the initial sub-pixel SP(1) and the last nth sub-pixel SP(n) of one row described with respect to some of FIGS. 4 to 10 and FIGS. 11 to 14 may have substantially the same structures as the initial sub-pixel SP(1) and the last nth sub-pixel SP(n) of each of the other rows in the display area DA. Further, a sub-pixel of the second pixel to the (m−1)th pixel of one row described with respect to some of FIGS. 4 to 10 and FIGS. 11 to 14 may have substantially the same structures as a sub-pixel of the second pixel to the (m−1)th pixel of each of the other rows in the display area DA.

In another embodiment of the present disclosure, the micro lenses in at least one sub-pixel can be provided to be rotated. Such a second example embodiment of the present disclosure is described in more detail with reference to FIG. 11. The second example embodiment is substantially the same as the first example embodiment, but the micro lenses in at least one sub-pixel can be rotated.

Figure 11:
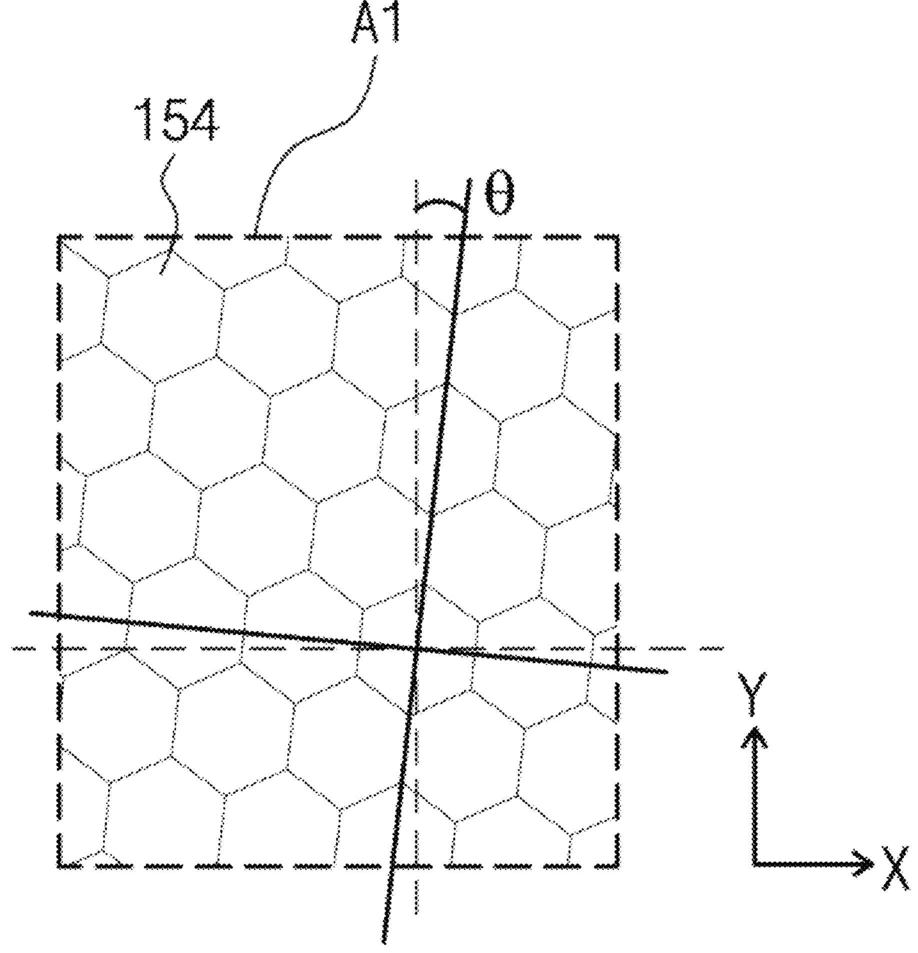
FIG. 11 is a schematic plan view of an organic light-emitting diode display device according to a second example embodiment of the present disclosure.

FIG. 11 is a schematic plan view of an organic light-emitting diode display device according to the second example embodiment of the present disclosure and is an enlarged view corresponding to the area A1 of FIG. 4. The first to fourth sub-pixels can be sequentially provided over the substrate 110.

In FIG. 11, the micro lenses 154 provided in at least one sub-pixel can be rotated clockwise or counterclockwise with respect to the first direction and/or the second direction. In this example, the first direction is the X direction, and the second direction is the Y direction.

For example, the micro lenses 154 can be rotated clockwise with an angle θ with respect to the first direction and/or the second direction. Accordingly, the line connecting the centers of the micro lenses 154 adjacent to each other can have the angle θ with respect to the first direction and/or the second direction.

Here, the angle θ can be selected from a range greater than 0 degrees and less than or equal to 60 degrees. For instance, the rotation angle of the micro lenses 154 can be between greater than 0 degrees and 60 degrees in the clockwise or counterclockwise direction. However, the embodiments of the present disclosure are not limited thereto. In one or more aspects, the angle θ can be selected from a range greater than or equal to 0 degrees and less than 60 degrees.

Further, the micro lenses 154 of all or some sub-pixels can be rotated. In this case, the micro lenses 154 of the adjacent sub-pixels can have different rotation angles.

For example, the micro lenses 154 in twenty sub-pixels arranged in a matrix form can be rotated clockwise or counterclockwise with a rotation angle of 3 degree difference and randomly arranged. However, embodiments of the present disclosure are not limited to the foregoing.

As such, in the organic light-emitting diode display device according to the second example embodiment of the present disclosure, the micro lenses 154 in at least one sub-pixel can be disposed to be rotated at a specific angle with respect to the first direction and/or the second direction. Accordingly, the diffraction pattern of the reflected light generated by the regular arrangement of the micro lenses 154 can be offset or minimized, or the diffraction pattern of the reflected light can be irregular or random, so the occurrence of a radial rainbow pattern or a radial circular ring pattern of the reflected light can be suppressed or minimized. Therefore, the image quality of the display device can be improved.

In another embodiment of the present disclosure, a flat portion for measuring the size of the opening of the bank can be provided. An organic light-emitting diode display device according to such a third example embodiment of the present disclosure is described in more detail with reference to FIG. 12.

Figure 12:
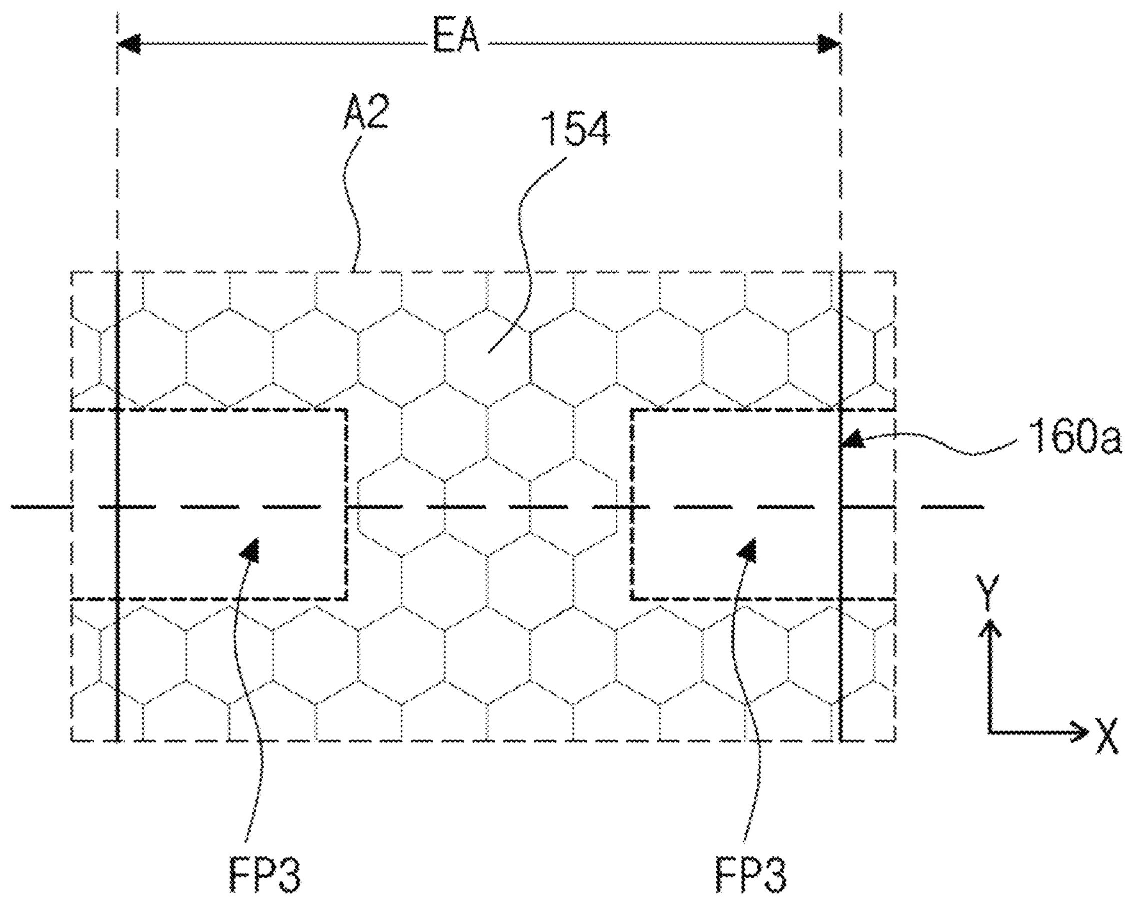
FIG. 12 is a schematic plan view of an organic light-emitting diode display device according to a third example embodiment of the present disclosure.

FIG. 12 is a schematic plan view of an organic light-emitting diode display device according to the third example embodiment of the present disclosure and is an enlarged view corresponding to the area A2 of FIG. 6. FIG. 12 is described in more detail with reference to FIG. 6 and FIG. 9 together. The organic light-emitting diode display device according to the third example embodiment of the present disclosure has substantially the same configuration as that of the first or second example embodiment, except for having a flat portion for measuring the size of the opening of the bank. The same or similar parts as the first or second example embodiment may be designated by the same or similar references, and repetitive descriptions for the same or similar parts may be omitted or shortened.

In FIG. 12, at least one of the first, second, third, and fourth sub-pixels SP1, SP2, SP3, and SP4 can include at least one third flat portion FP3 in the emission area EA.

In this example, the first sub-pixel SP1 can have two third flat portions FP3 in the emission area EA.

The two third flat portions FP3 can be placed at both sides of the emission area EA facing each other along the first direction, respectively, and can be disposed on the same straight line. The micro lens 154 may not be provided in the third flat portions FP3. The top surface of the overcoat layer 150 corresponding to the third flat portions FP3 can be flat or substantially flat without any micro lens.

Additionally, in the first sub-pixel SP1, two side surfaces of the bank 160 facing each other can be disposed over the two third flat portions FP3, respectively.

The two third flat portions FP3 can be used advantageously for measuring the size of the opening 160*a* of the bank 160.

The size of the emission area EA and the number of micro lenses 154 can be determined according to the size of the opening 160*a* of the bank 160. When the size of the opening 160*a* is smaller than a set range, the number of micro lenses 154 contributing to the light extraction can be reduced, thereby decreasing or adjusting the light extraction efficiency. Accordingly, it is necessary to manage the size of the opening 160*a* within a specific range.

In this example, the size of the opening 160*a* can be measured by photographing an optical image of the patterned bank 160, but the optical image can be distorted due to the micro lenses 154. Accordingly, in the third example embodiment of the present disclosure, the third flat portions FP3 where the micro lenses 154 are not substantially placed can be provided in the emission area EA, and the boundary of the emission area EA (that is, the boundary of the opening 160*a*) can be disposed over the third flat portions FP3, so that the size of the opening 160*a* of the bank 160 and the distance between the openings 160*a* (for example, the width of the bank 160) can be accurately measured without distortion of the gray level.

In an example, each third flat portion FP3 can be greater than or equal to the area of four micro lenses 154 while be smaller than or equal to the area of nine micro lenses 154, but embodiments of the present disclosure are not limited thereto.

Meanwhile, the third flat portion FP3 can have a different size from the first flat portion FP1, which is provided in the emission area EA of each of the initial sub-pixel SP(1) of FIG. 4 and the last nth sub-pixel SP(n) of FIG. 5.

As such, in the third example embodiment of the present disclosure, by providing the third flat portions FP3 where at least a part of the top surface of the overcoat layer 150 can be flat or substantially flat in the emission area EA and disposing the boundary of the bank 160 over the third flat portions FP3, the size of the opening 160*a* and the width of the bank 160 can be accurately measured without distortion of the gray level. Therefore, since the opening 160*a* of the bank 160 can be managed with (or provided within) a specific range, it is possible to prevent the light extraction efficiency of the display device from being lowered.

In another embodiment of the present disclosure, the first electrode and the opening of the bank of the organic light-emitting diode display device each can have at least one corner cutting structure. An organic light-emitting diode display device according to such a fourth embodiment of present disclosure is described in more detail with reference to FIG. 13 and FIG. 14.

Figure 13:
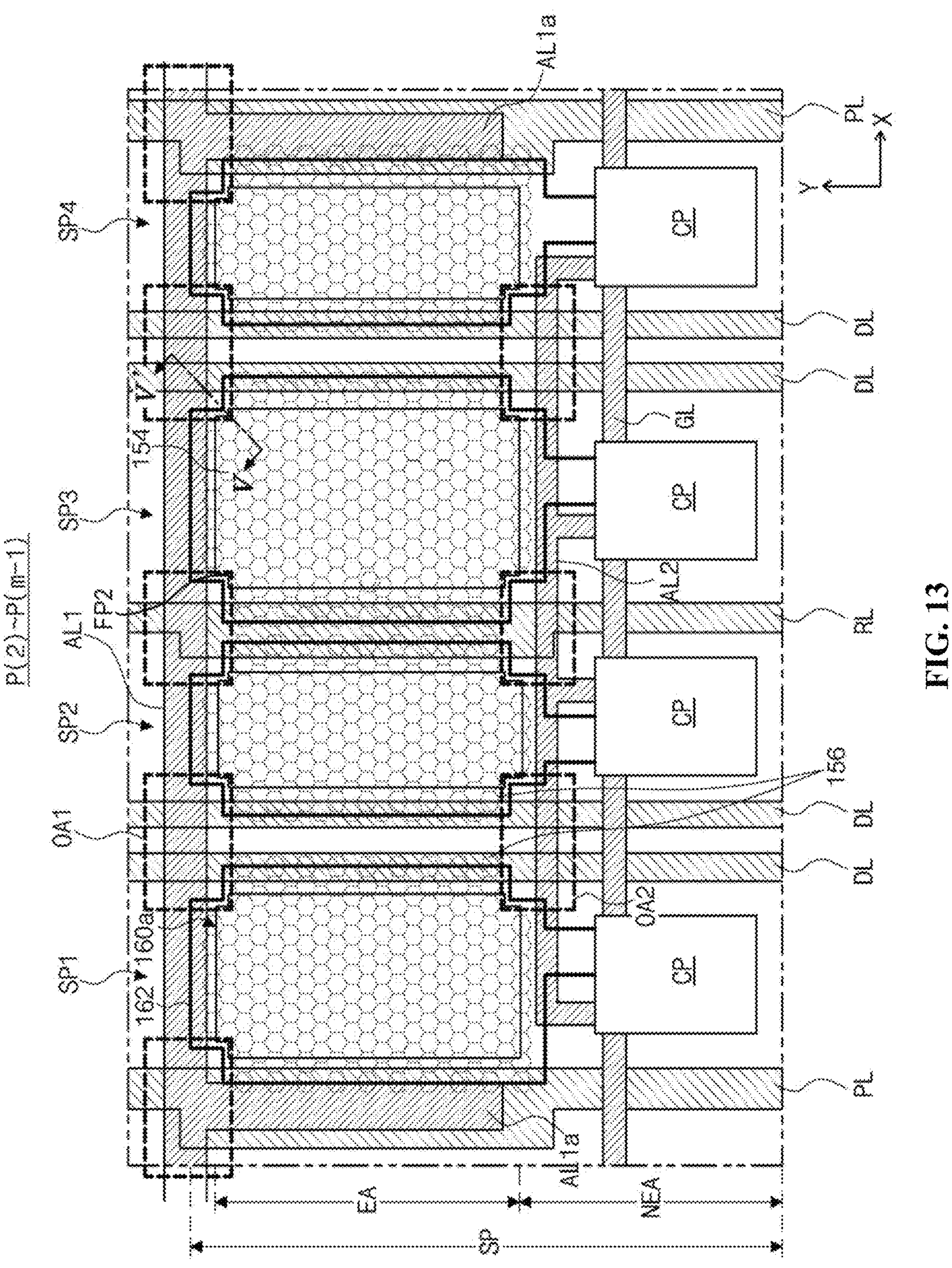
FIG. 13 is a schematic plan view of an organic light-emitting diode display device according to a fourth example embodiment of the present disclosure.
Figure 14:
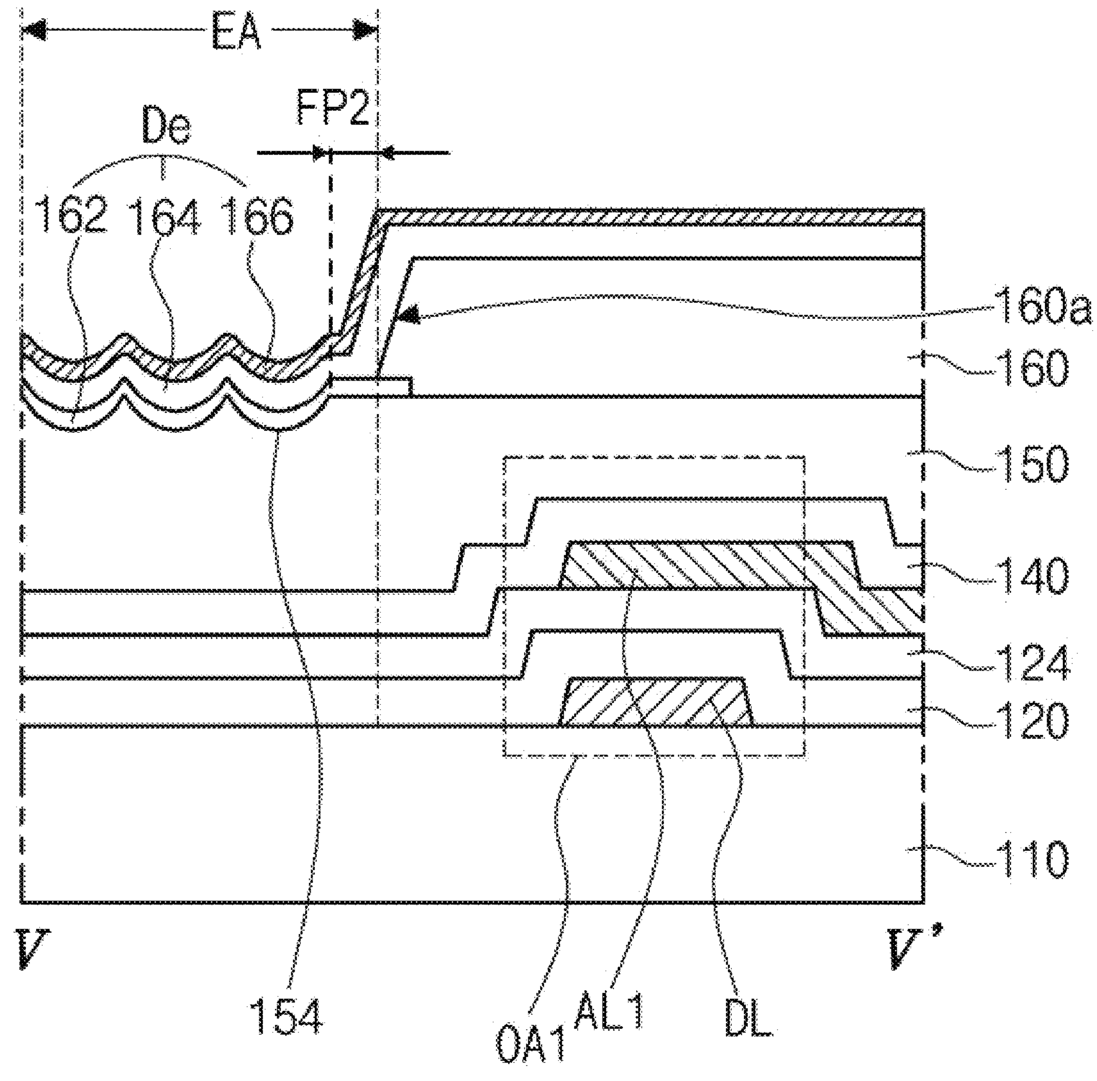
FIG. 14 is an example of a cross-sectional view corresponding to the line V-V' of FIG. 13.

FIG. 13 is a schematic plan view of an organic light-emitting diode display device according to the fourth example embodiment of the present disclosure, and FIG. 14 is an example of a cross-sectional view corresponding to the line V-V' of FIG. 13. FIG. 13 and FIG. 14 show one of the second pixel to the (m−1)th pixel. The organic light-emitting diode display device according to the fourth example embodiment of the present disclosure has substantially the same configuration as that of the first, second, or third example embodiment, except for having at least one corner cutting structure. The same or similar parts as the first, second, or third example embodiment may be designated by the same or similar references, and repetitive descriptions for the same or similar parts may be omitted or shortened.

As shown in FIG. 13 and FIG. 14, in the organic light-emitting diode display device according to the fourth example embodiment of the present disclosure, the first electrode 162 and the opening 160*a* of the bank 160 of each of the first, second, third, and fourth sub-pixels SP1, SP2, SP3, and SP4 can have a corner cutting structure at the at least one corner.

Specifically, each of the first electrode 162 and the opening 160*a* of the bank 160 of each sub-pixel SP1, SP2, SP3, and SP4 can have the corner cutting structures at (or corresponding to) the first and second overlap portions OA1 and OA2. In this case, the corners of each of the first electrode 162 and the opening 160*a* of the bank 160 can be partially removed in an angled shape and can be inward to the emission area EA. In one or more aspects, the phrase "inward" may be described further using one or more examples. In an example, compared to the structure shown in FIG. 10, in FIG. 14, a flat portion of the first electrode 162 (located at the second flat portion FP2 and under the bank 160) may be shorter, and thus a corner (or an end) of the first electrode 162 may be closer to the center of the emission area EA. Compared to the structure shown in FIG. 10, in FIG. 14, the size (or the length along the first direction) of the second flat portion FP2 is shorter, and thus, the corner (or an end) of the opening 160*a* of the bank 160 may be closer to the center of the emission area EA.

The micro lenses 154 and the dummy lenses 156 may not be provided to correspond to (or at) the corner cutting structures. Accordingly, the micro lenses 154 can be spaced apart from the edges of the bank 160 having the corner cutting structures. In addition, the micro lenses 154 can be spaced apart from the edges of the first electrode 162 having the corner cutting structures.

Accordingly, the emission area EA of each sub-pixel SP1, SP2, SP3, and SP4 can have the second flat portions FP2 corresponding to (or at) the corner cutting structures, and the overcoat layer 150 can have the flat top surface in the second flat portions FP2.

In this example, each of the first electrode 162 and the opening 160*a* of the bank 160 is shown as having the corner cutting structures of the angled shape, but embodiments of the present disclosure are not limited thereto. Alternatively, each of the first electrode 162 and the opening 160*a* of the bank 160 can have the corner cutting structures of a curved or inclined shape corresponding to (or at or near) the first and second overlap portions OA1 and OA2.

As such, in the organic light-emitting diode display device according to the fourth example embodiment of the present disclosure, by providing the first electrode 162 and the opening 160*a* of the bank 160 each having the corner cutting structures corresponding to the first and second overlap portions OA1 and OA2, the first electrode 162 and the signal lines thereunder corresponding to (or at or near) the first and second overlap portions OA1 and OA2 can be spaced apart from each other without overlapping, so that the electrical short circuit between the first electrode 162 and the signal lines thereunder due to the double step difference of the signal lines can be further prevented. Stated in another way, in one or more aspects, the first electrode 162 does not overlap the signal lines (e.g., AL1 and DL of FIG. 14) at or near the first and second overlap portions OA1 and OA2.

In the organic light-emitting diode display device of one or more embodiments of the present disclosure, the plurality of micro lenses can be provided in the emission area of each sub-pixel, so the light extraction efficiency can be improved. Accordingly, power consumption can be reduced due to the improved efficiency and luminance, thereby utilizing low power consumption.

Additionally, in the initial sub-pixel and the last sub-pixel disposed at the opposite edges of the display area, by placing the micro lenses to be spaced apart from the outer edges of the opening of the bank, the loss of the insulation layers thereunder can be prevented during the process of forming the micro lenses, and the electrical short circuit between the first electrode and the signal lines thereunder can be prevented. Accordingly, it is possible to prevent the bright spot defects, thereby improving the image quality of the display device.

Further, the first electrode and the opening of the bank can be configured to having the corner cutting structures around the overlap portions such that the corners can be inward to the emission area, and thus the electrical short circuit between the first electrode and the signal lines thereunder due to the double step difference can be further prevented.

Additionally, by providing the dummy lens outside the opening of the bank, the vertical stripe-shaped stains can be improved.

Furthermore, by rotating the micro lenses in at least one sub-pixel, the rainbow pattern and/or the circular ring pattern occurring due to the regular arrangement can be prevented or minimized, thereby improving the image quality of the display device.

Moreover, by providing the flat portion where the micro lenses are not placed in the emission area, the size of the opening of the bank can be accurately measured and managed, so the light extraction efficiency can be prevented from decreasing.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting diode display device, comprising:

a display area and a non-display area outside the display area;

a plurality of sub-pixels in the display area, each sub-pixel having an emission area and a non-emission area; and an overcoat layer including a plurality of micro lenses in the emission area of each sub-pixel, wherein for an outermost sub-pixel among the plurality of sub-pixels, the overcoat layer has a first flat portion where some micro lenses are removed from the emission area, and wherein for each of the plurality of sub-pixels, the overcoat layer has a second flat portion where some micro lenses are removed at a corner of the emission area.

2. The organic light-emitting diode display device of claim 1, wherein the first flat portion is provided in the outermost sub-pixel at each of first and second sides of the display area.

3. The organic light-emitting diode display device of claim 1, further comprising a first line disposed in a direction parallel to first and second sides of the display area, wherein for the outermost sub-pixel, the plurality of micro lenses are spaced apart from the first line.

4. The organic light-emitting diode display device of claim 3, wherein:

a first emission area is the emission area of the outermost sub-pixel;

a second emission area is the emission area of a sub-pixel adjacent to the outermost sub-pixel along a first direction;

the organic light-emitting diode display device further comprises a second line disposed between the first and second emission areas; and for the sub-pixel adjacent to the outermost sub-pixel along the first direction, the plurality of micro lenses overlap the second line.

5. The organic light-emitting diode display device of claim 1, wherein the first flat portion is provided at a first side of an outermost sub-pixel at a first side of the display area and at a second side of an outermost sub-pixel at a second side of the display area.

6. The organic light-emitting diode display device of claim 1, further comprising one or more first lines adjacent to or overlapping the plurality of sub-pixels and one or more second lines between the emission areas of the plurality of sub-pixels, wherein:

the one or more second lines are arranged in a direction different from a direction of the one or more first lines; and the second flat portion is disposed in an overlap portion where at least one of the one or more first lines overlap at least one of the one or more second lines.

7. An organic light-emitting diode display device, comprising:

a substrate;

a plurality of sub-pixels, each sub-pixel having an emission area and a non-emission area;

a circuit portion in the non-emission area of each sub-pixel, the circuit portion including a thin film transistor;

an overcoat layer over the thin film transistors, and including a plurality of micro lenses in the emission area of each sub-pixel;

a light-emitting diode in the emission area of each sub-pixel over the overcoat layer, and connected to the corresponding thin film transistor; and a bank having an opening corresponding to the emission area, wherein the plurality of sub-pixels includes first to nth sub-pixels (where n is an integer greater than 1) sequentially arranged along a first direction, wherein for each of the first sub-pixel and the nth sub-pixel, the bank has first and second side surfaces facing each other along the first direction, wherein for the first sub-pixel, the plurality of micro lenses are spaced apart from the first side surface of the bank and overlap the second side surface of the bank, and wherein for the nth sub-pixel, the plurality of micro lenses overlap the first side surface of the bank and are spaced apart from the second side surface of the bank.

8. The organic light-emitting diode display device of claim 7, further comprising at least a first line disposed in the first direction over the substrate; and at least a second line disposed in a second direction and overlapping the at least a first line to form an overlap portion, wherein for each of the first to nth sub-pixels, the plurality of micro lenses are spaced apart from the overlap portion.

9. The organic light-emitting diode display device of claim 8, wherein for each of the first to nth sub-pixels, the plurality of micro lenses are spaced apart from a corner of the opening of the bank adjacent to the overlap portion.

10. The organic light-emitting diode display device of claim 9, wherein the light-emitting diode includes a first electrode, a light-emitting layer, and a second electrode, and wherein for each of the first to nth sub-pixels, each of the first electrode and the opening of the bank has a corner corresponding to the overlap portion and being inward to the emission area.

11. The organic light-emitting diode display device of claim 8, wherein the at least a first line includes at least one of a gate line and an auxiliary line, wherein the at least a second line includes at least one of a power line, a data line, and a reference line, and wherein the auxiliary line overlaps at least one of the power line, the data line, and the reference line to form the overlap portion.

12. The organic light-emitting diode display device of claim 7, wherein the overcoat layer further includes dummy lenses in the non-emission area, and wherein the dummy lenses are spaced apart from the opening.

13. The organic light-emitting diode display device of claim 12, wherein for the first sub-pixel, the dummy lenses are provided in the non-emission area corresponding to the second side surface of the bank, and wherein for the nth sub-pixel, the dummy lenses are provided in the non-emission area corresponding to the first side surface of the bank.

14. The organic light-emitting diode display device of claim 12, wherein the dummy lenses have a same size and shape as the plurality of micro lenses.

15. The organic light-emitting diode display device of claim 7, wherein the plurality of micro lenses in at least one of the first to nth sub-pixels are rotated at a rotation angle, so that a line connecting centers of the rotated plurality of micro lenses adjacent to each other has a specific angle with respect to the first direction.

16. The organic light-emitting diode display device of claim 15, wherein:

the rotation angle of the rotated plurality of micro lenses is formed by the specific angle; and the rotation angle of the rotated plurality of micro lenses is greater than 0 degrees and is less than 60 degrees.

17. A light emitting display device, comprising:

a plurality of sub-pixels in a display area, each sub-pixel having an emission area and a non-emission area; and a plurality of micro lenses in the emission area of each sub-pixel, wherein:

the plurality of sub-pixels comprise a first sub-pixel disposed near an edge side of the display area, and a second sub-pixel disposed away from the edge side of the display area;

the emission area has a first side; and an arrangement of the plurality of micro lenses for the first sub-pixel is different from an arrangement of the plurality of micro lenses for the second sub-pixel in that:

for the first sub-pixel, the plurality of micro lenses do not extend to the first side of the emission area; and for the second sub-pixel, the plurality of micro lenses extend at least to the first side of the emission area.

18. The light emitting display device of claim 17, further comprising:

a light-emitting diode including an electrode, wherein for the first sub-pixel:

the first side of the emission area is near the edge side of the display area;

the electrode of the light-emitting diode extends to and beyond the first side of the emission area while the plurality of micro lenses do not extend to the first side of the emission area; and the electrode of the light-emitting diode and the plurality of micro lenses extend to and beyond a second side of the emission area.

* * * * *